US 9,237,285 B2

United States Patent
Ui et al.

(10) Patent No.: US 9,237,285 B2
(45) Date of Patent: *Jan. 12, 2016

(54) SOLID-STATE IMAGE PICKUP DEVICE AND CAMERA SYSTEM

(71) Applicant: Sony Corporation, Tokyo (JP)

(72) Inventors: Hiroki Ui, Tokyo (JP); Tomohiro Takahashi, Kanagawa (JP); Hirofumi Kikutsugi, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,748

(22) Filed: May 2, 2014

(65) Prior Publication Data

US 2014/0240564 A1     Aug. 28, 2014

Related U.S. Application Data

(63) Continuation of application No. 13/144,529, filed as application No. PCT/JP2009/071763 on Dec. 28, 2009, now Pat. No. 8,743,251.

(30) Foreign Application Priority Data

Jan. 21, 2009  (JP) .................................. 2009-011231

(51) Int. Cl.
*H04N 5/374* (2011.01)
*H04N 5/341* (2011.01)
(Continued)

(52) U.S. Cl.
CPC .......... *H04N 5/374* (2013.01); *H01L 27/14641* (2013.01); *H04N 5/335* (2013.01);
(Continued)

(58) Field of Classification Search
CPC ..... H04N 5/335; H04N 5/341; H04N 5/3452; H04N 5/3594; H04N 5/374; H04N 5/37457; H04N 5/3765; H01L 27/14641
See application file for complete search history.

(56) References Cited

U.S. PATENT DOCUMENTS

| 8,130,300 | B2* | 3/2012 | Johnson | 348/308 |
| 8,743,251 | B2* | 6/2014 | Ui | H01L 27/14641 250/208.1 |
| 8,964,076 | B2* | 2/2015 | Ui | H01L 27/14641 250/208.1 |

(Continued)

FOREIGN PATENT DOCUMENTS

| JP | 08-195980 | 7/1996 |
| JP | 2000-350103 | 12/2000 |

(Continued)

OTHER PUBLICATIONS

PCT International Search Report dated Jan. 21, 2009.

*Primary Examiner* — Daniel M Pasiewicz
(74) *Attorney, Agent, or Firm* — Hazuki International, LLC

(57) ABSTRACT

A solid-state image pickup device including a pixel section arranged with multiple pixel circuits in matrix having functions for converting an optical signal to an electrical signal and for accumulating the electrical signal depending on an exposure time, and a pixel driving section capable of driving through a control line to reset, accumulate, transfer, and output signal electric charge of the pixel section. The pixel section may have a pixel shared structure arranged with one selection control line, one reset control line, and multiple transfer control lines, including a readout-pixel section and an unread-pixel section in its entirety. The pixel driving section includes a pixel control section where an unread-pixel is normally fixed in a reset state. When reading a readout-pixel in a shared relationship, if its address is selected or a selection signal becomes active, the unread-pixel reset-state is cancelled to turn into an unread state.

14 Claims, 19 Drawing Sheets

(51) Int. Cl.
  *H04N 5/345* (2011.01)
  *H04N 5/3745* (2011.01)
  *H04N 5/376* (2011.01)
  *H04N 5/335* (2011.01)
  *H04N 5/359* (2011.01)
  *H01L 27/146* (2006.01)

(52) U.S. Cl.
  CPC ............ *H04N 5/341* (2013.01); *H04N 5/3452* (2013.01); *H04N 5/3594* (2013.01); *H04N 5/3765* (2013.01); *H04N 5/37457* (2013.01)

(56) References Cited

U.S. PATENT DOCUMENTS

| | | |
|---|---|---|
| 2006/0237721 A1 | 10/2006 | Muramatsu et al. |
| 2007/0165123 A1* | 7/2007 | Panicacci ...................... 348/294 |
| 2009/0053848 A1* | 2/2009 | Fan ................................ 438/59 |

FOREIGN PATENT DOCUMENTS

| | | |
|---|---|---|
| JP | 2006-310932 | 11/2006 |
| JP | 2008-172704 | 7/2008 |

* cited by examiner

RAM AND WRITE CIRCUIT

FIG. 12

| | | INPUT OUTPUT | | | | | |
|---|---|---|---|---|---|---|---|
| OR CIRCUIT | | A1 ─┐⟩─ B A2 ─┘ | | | | *NOT APPLIED IN CASE OF GND | |
| OG21 | A1 | TX[2n] | L | | L | H | |
| | A2 | GND | L | | H | H | |
| | B | TX'[2n] | L | | H | H | |
| OG20 | A1 | TX[2n+1] | | H | L | H | |
| | A2 | V1 | | L | H | H | |
| | B | TX'[2n+1] | | H | H | H | |
| NOR CIRCUIT | | A1 ─┐⟩o─ B A2 ─┘ | | | | | |
| NG1 | A1 | SIG[m] | L | H | L | | |
| | A2 | SEL[n] | L | L | H | | |
| | B | V1 | H | L | L | | |
| NAND CIRCUIT | | A1 ─┐o⟩o─ B A2 ─┘ | | | | | |
| NA1 | A1 | SEL[n] | L | H | L | | |
| | A2 | RST[n] | L | L | H | | |
| | B | RST'[n] | H | H | H | | |

FIG. 17

| OR CIRCUIT | | INPUT A1, A2 → OUTPUT B | | | | *NOT APPLIED IN CASE OF GND | |
|---|---|---|---|---|---|---|---|
| OG41 | A1 | TX[4n] | L | | | L | H |
| | A2 | GND | L | | | H | H |
| | B | TX'[4n] | L | | | H | H |
| OG40 | A1 | TX[4n+1] | | H | L | H | |
| | A2 | V1' | | L | H | H | |
| | B | TX'[4n+1] | | H | H | H | |
| OG50 | A1 | TX[4n+2] | | H | L | H | |
| | A2 | V2' | | L | H | H | |
| | B | TX'[4n+2] | | H | H | H | |
| OG51 | A1 | TX[4n+3] | L | | | L | H |
| | A2 | GND | L | | | H | H |
| | B | TX'[4n+3] | L | | | H | H |

| NOR CIRCUIT | | INPUT A1, A2 → OUTPUT B | | | | *NOT APPLIED IN CASE OF GND |
|---|---|---|---|---|---|---|
| NG11 | A1 | SIG[m'] | L | H | L | |
| | A2 | SEL[n] | L | L | H | |
| | B | V1' | H | L | L | |
| NG12 | A1 | SIG[m'] | L | H | L | |
| | A2 | SEL[n] | L | L | H | |
| | B | V2' | H | L | L | |

| NAND CIRCUIT | | INPUT A1, A2 → OUTPUT B | | | | |
|---|---|---|---|---|---|---|
| NA3 | A1 | SEL[n] | L | H | L | |
| | A2 | RST[n] | L | L | H | |
| | B | RST'[n] | H | H | H | |

SOLID-STATE IMAGE PICKUP DEVICE AND CAMERA SYSTEM

RELATED APPLICATION DATA

This application is a continuation of U.S. patent application Ser. No. 13/144,529 filed Oct. 3, 2011, which is a national stage filing of PCT/JP2009/71763 filed Dec. 28, 2009, the entirety of which are incorporated herein by reference to the extent permitted by law. The present application claims the benefit of priority to Japanese Patent Application No. JP 2009-011231 filed on Jan. 21, 2009 in the Japan Patent Office, the entirety of which is incorporated by reference herein to the extent permitted by law.

TECHNICAL FIELD

The present invention relates to a solid-state image pickup device and a camera system, which are represented by a CMOS image sensor.

BACKGROUND ART

In recent years, as a solid-state image pickup device (an image sensor) alternative of a CCD, a CMOS (Complimentary Metal Oxide Semiconductor) image sensor attracts attention.

This is because the CMOS image sensor has overcome the following issues.

That is, producing CCD pixels needs a dedicated process, and operating the CCD pixels needs a plurality of power sources, further, it needs to combine a plurality of peripheral ICs to be operated.

On the contrary, the CMOS image sensor has overcome various problems of such CCD in which systems become extremely complex. Therefore, as described above, it attracts attention.

The CMOS image sensor uses the production process same as the one for an ordinary CMOS type integrated circuit, and can be operated by a single power source, further can have an mixture of an analog circuit and a logic circuit using the CMOS process, in the same chip.

For this reason, the CMOS image sensor has a plurality of great advantages, such as decreasing the number of peripheral ICs, or the like.

Mainstream of an output circuit of the CCD is a single channel (ch) output using a FD amplifier having a floating diffusion layer (FD).

On the contrary, the CMOS image sensor has a FD amplifier for each pixel, and mainstream of its output is a column-parallel output type for selecting one line from a pixel array, and for reading out in a column direction at once.

This is because the FD amplifier arranged inside of pixels hardly obtain efficient driving capability, causing necessity of decreasing data rate, and a parallel processing seems to be advantageous.

Such CMOS image sensor has been used as an image pick up device in a imaging apparatus, such as a digital camera, a camcorder, a surveillance camera, an onboard camera, or the like.

FIG. 1 is a diagram showing an example of an average structure of a CMOS image sensor that arranges pixels in a two-dimensional array.

A CMOS image sensor 10 in FIG. 1 is configured by a pixel array section 11, a vertical scan circuit (Vdec: pixel driving circuit) 12, and a column readout circuit (column processing circuit) 13.

The pixel array section 11 arranges a pixel circuit in a matrix of M rows and N columns.

The vertical scan circuit 12 controls an operation of pixel arranged in an arbitrary row in the pixel array section 11. The vertical scan circuit 12 controls pixels through control lines LRST, LTX, and LSEL.

The readout circuit 13 receives pixel row data controlled reading by the vertical scan circuit 12 through an output signal line LSGN, and transfers it to a signal processing circuit in the post-stage.

The readout circuit 13 includes a correlated double ampling circuit (CDS: Correlated Double Sampling) or an analog digital converter (ADC).

FIG. 2 is a diagram showing an example of pixel circuit of a CMOS image sensor configured by four transistors.

This pixel circuit 20 has, for example, a photoelectric conversion element 21 composed of photo diodes (PD) (hereinafter, referred to as simply PD, in some cases).

The pixel circuit 20 includes, for this one unit of the photoelectric conversion element 21, four transistors of a transfer transistor 22, a reset transistor 23, an amplifier transistor 24, and selection transistor 25, as active devices.

The photoelectric conversion element 21 photoelectrically converts incident lights into an amount of electric charge (as here, electron thereof) according to an amount of light thereof.

The transfer transistor 22 is connected between the photoelectric conversion element 21 and a floating diffusion FD hereinafter, referred to simply as FD, in some cases), and is to be given a transfer signal (a driving signal) TX to its gate (a transfer gate) through a transfer control line LTX.

Thus, the electron photoelectrically converted by the photoelectric conversion element 21 is transferred to the floating diffusion FD.

The reset transistor 23 is connected between a power supply line LVREF and the floating diffusion FD, and is to be given a reset signal RST to its gate through a reset control LRST.

Thus, the reset transistor 23 resets an electric potential of the floating diffusion FD to an electric potential of the power supply line LVDD.

The floating diffusion FD is connected with a gate of the amplifier transistor 24. The amplifier transistor 24 is connected to a signal line 26 (LSGN in FIG. 1) through the selection transistor 25, and constitutes a source follower with a constant current source outside a pixel section.

And, an address signal (a selection signal) SEL is to be given to the gate of the selection transistor 25 through a selection control line LSEL, and the selection transistor is turned on.

When the selection transistor 25 is turned on, the amplifier transistor 24 amplifiers the electric potential of the floating diffusion FD, and outputs voltage to the signal line 26. The voltage outputted by each pixel is to be outputted to the readout circuit 13 via the signal line 26.

This reset operation of pixels is to turn on the transfer transistor 22, and to transfer the electric charge accumulated in the photoelectric conversion element 21 to the floating diffusion FD, so as to output the electric charge accumulated in the floating diffusion FD.

At this time, the floating diffusion FD discards the electric charge to a side of power source by turning on the reset transistor 23 in advance so as to receive the electric charge of the photoelectric conversion element 21. Instead, it may discards the electric charge directly to the power source by turning on the reset transistor 23 in parallel while turning on the transfer transistor 22, in some cases.

To simplify these series of operation, it is called as "a pixel reset operation" or "a shutter operation".

On the other hand, in a readout operation, at first, the reset transistor 23 is turned on to reset the floating diffusion FD, and via the selection transistor 25 which is turned on in the state, an output is performed to an output signal line 26. This is called as a P-phase output.

Subsequently, the transfer transistor 22 is turned on to transfer the electric charge accumulated in the photoelectric conversion element 21 to the floating diffusion FD, and its output is output to the signal line 26. This is called as D-phase output.

The difference between the D-phase output and the P-phase output outside of the pixel circuit to make it as an image signal, cancelling reset noise of the floating diffusion FD.

To simplify these series of operation, it is called simply as "a pixel readout operation".

The transfer control line LTX, the reset control line LRST, and the selection control line LSEL are driven selectively by the vertical scan circuit 12.

As a structure of a pixel circuit, in addition to a four-transistor structure (4Tr-type) pixel circuit, it is possible to adapt a three-transistor structure (3Tr-type), a five-transistor structure (5Tr-type), or the like.

The above circuits are basic structures having the photoelectric conversion element in each pixel.

In addition, CMOS is also well-known for having a pixel section which has a pixel shared structure in which one selection control line, one reset control line, and a plurality of transfer control lines are arranged, and which includes a readout pixel section and an unread pixel section in the entirety.

One of features of CMOS image sensor having such structure is a function of random access to the pixel array section.

This realizes high-speed video that increases a frame rate by thinning necessary pixels to read out, a function for capturing determined region only to read out, or the like (for example, refer to Patent Literature 1).

FIG. 3 is a conceptual diagram for showing a structure of a CMOS image sensor which adapted a thinning and reading method, in case of 2 pixels shared.

This pixel section 11A shares, as shown in FIG. 3, the selection control line LSEL and the reset control line LRST, and two of the transfer control lines LTX1 and LTX2 are wired corresponding to two of photoelectric conversion elements, 21-1 (PD1) and 21-2 (PD2).

Before starting reading out, a reset state is set once, and after emptying the electrical charge left in the photoelectric conversion elements 21-1 and 21-2, next readout operation starts.

However, when reading out after thinning, if unread pixels are left as they are, there may be a possibility to cause blooming in which the electrical charge accumulated in the pixels leaks into the surroundings to be mixed with signals of the readout pixels.

To avoid this mixture of signals, the unread pixels also need to exclude the electrical charge from the pixels.

Various technologies have been provided for preventing occurrence of this blooming (for example, refer to Patent Literature 1).

CITATION LIST

Patent Literature

Patent Literature 1: JP 2006-310932A

SUMMARY OF INVENTION

Technical Problem

In Patent Literature 1, a CMOS image sensor, which is capable of capturing partially and reading out pixel information of an arbitrary region of the pixel array section, does not perform an access control in upper and lower unread rows other than a readout region.

For this reason, it has been pointed out a problem causing so-called blooming in which the accumulated electric charge is photoelectrically converted in the photoelectric conversion element in pixels, and leaked into the surrounding pixels exceeding an accumulation capacity of the photoelectric conversion element.

For its solution, it is considered a control method for controlling reset of non-accessed rows other than an arbitrary setting region all at once, while setting the arbitrary region to readout partially, however, it is difficult to configure its control circuit.

Moreover, it is said that there is some concern that the resetting all at once consumes more energy and increases noise.

In the light of foregoing, as its solution, for the upper and lower non-accessed rows in the arbitrary partially readout region, it is disclosed a method for controlling of resetting non-accessed rows sequentially one by one at the same time of reading out an arbitrary row in the readout region, or the like.

In this case, for preventing blooming, rows not to readout may be fixed to be reset.

If it remains fixed to be reset, however, the transfer control line LTX1 is high level "H".

For this reason, when to set a transfer control line LTX2 to high level "H" and readout the signal of the photoelectric conversion element 21-2, as a dotted line <1> shows in FIG. 3, a diode PD1 can be seen electrically, which is extremely inconvenient.

The present invention is to provide a solid-state image pickup device and a camera system capable of preventing certainly an occurrence of blooming of unread pixels.

Solution to Problem

A solid-state image pickup device according to the first perspective of the present invention includes a pixel section arranged with a plurality of pixel circuits in matrix having functions for converting an optical signal to an electrical signal and for accumulating the electrical signal depending on an exposure time, and a pixel driving section capable of driving through a control line so as to reset, accumulate, transfer, and output signal electric charge of the pixel section. The pixel section may have a pixel shared structure which is arranged with one selection control line, one reset control line, and a plurality of transfer control lines, and which includes a readout pixel section and an unread pixel section in its entirety, and the pixel driving section may include a pixel control section in which an unread pixel is normally fixed in a reset state, and when reading a readout pixel in a shared relationship, if its address is selected or a selection signal becomes active, the reset state of the unread pixel is cancelled to turn into an unread state.

A camera system according to the second perspective of the present invention includes a solid-state image pickup device, an optical system for forming an image of a subject on the image pickup device, and a signal processing circuit for processing an output image signal of the image pickup device. The solid-state image pickup device may include a pixel section arranged with a plurality of pixel circuits in matrix having functions for converting an optical signal to an electrical signal and for accumulating the electrical signal depending on an exposure time, and a pixel driving section capable of driving through a control line so as to reset, accumulate, transfer, and output signal electric charge of the pixel section. The pixel section may have a pixel shared structure which is arranged with one selection control line, one reset control line, and a plurality of transfer control lines, and which includes a readout pixel section and an unread pixel section in its entirety, and the pixel driving section includes a pixel control section in which the unread pixel is normally fixed in a reset state, and when reading the readout pixel in a shared relationship, if its address is selected or a selection signal becomes active, the reset state of the unread pixel is cancelled to turn into an unread state.

According to the present invention, in a pixel control section, the unread pixel is normally fixed in a reset state, and when reading the readout pixel in a shared relationship, if its address is selected or a selection signal becomes active, the reset state of the unread pixel is cancelled to turn into an unread state.

According to the present invention, it is possible to certainly prevent the occurrence of blooming of the unread pixels.

BRIEF DESCRIPTION OF DRAWINGS

FIG. 12 shows circuits and operation functions indicating in groups in MIL logic symbols related to FIG. 11.

FIG. 17 shows circuits and operation functions indicating in groups in MIL logic symbols related to FIG. 16.

Figure 1:
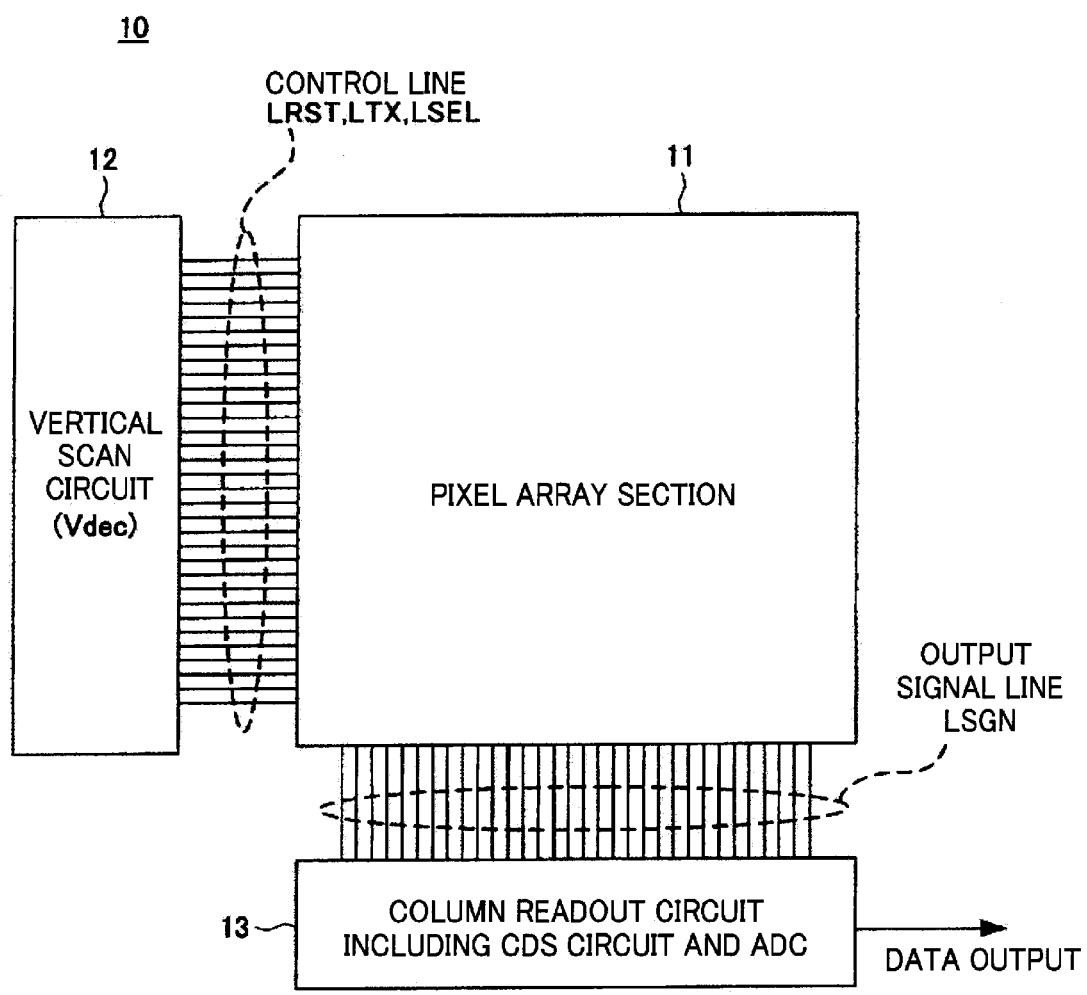
FIG. 1 is a diagram showing an example of an average structure of a CMOS image sensor (a solid-state image pickup device) that arranges pixels in a two-dimensional array.

REFERENCE SIGNS LIST 100 solid-state image pickup device
110 pixel array section
110A pixel section
120 vertical scan circuit
120A to 120E pixel control section
130 column readout circuit
111 photoelectric conversion element
112-1 to 112-4 transfer transistor
113 reset transistor
114 amplifier transistor
115 selection transistor
200 solid-state image pickup device
210 pixel array section
220 vertical scan circuit
230 horizontal transfer scan circuit
240 timing control circuit
250 ADC group
260 DAC
270 amplifier circuit (S/A)
280 signal processing circuit
300 camera system
310 imaging device
320 drive circuit
330 lens
340 signal processing circuit

DESCRIPTION OF EMBODIMENTS

Description will be given in the following order.
1. First Embodiment (Structure Example of Solid-State Image Pickup Device)
2. Second Embodiment (Structure Example of Solid-State Image Pickup Device Mounted with Column-Parallel ADC)
3. Third Embodiment (Structure Example of Camera System)

1. First Embodiment

Figure 4:
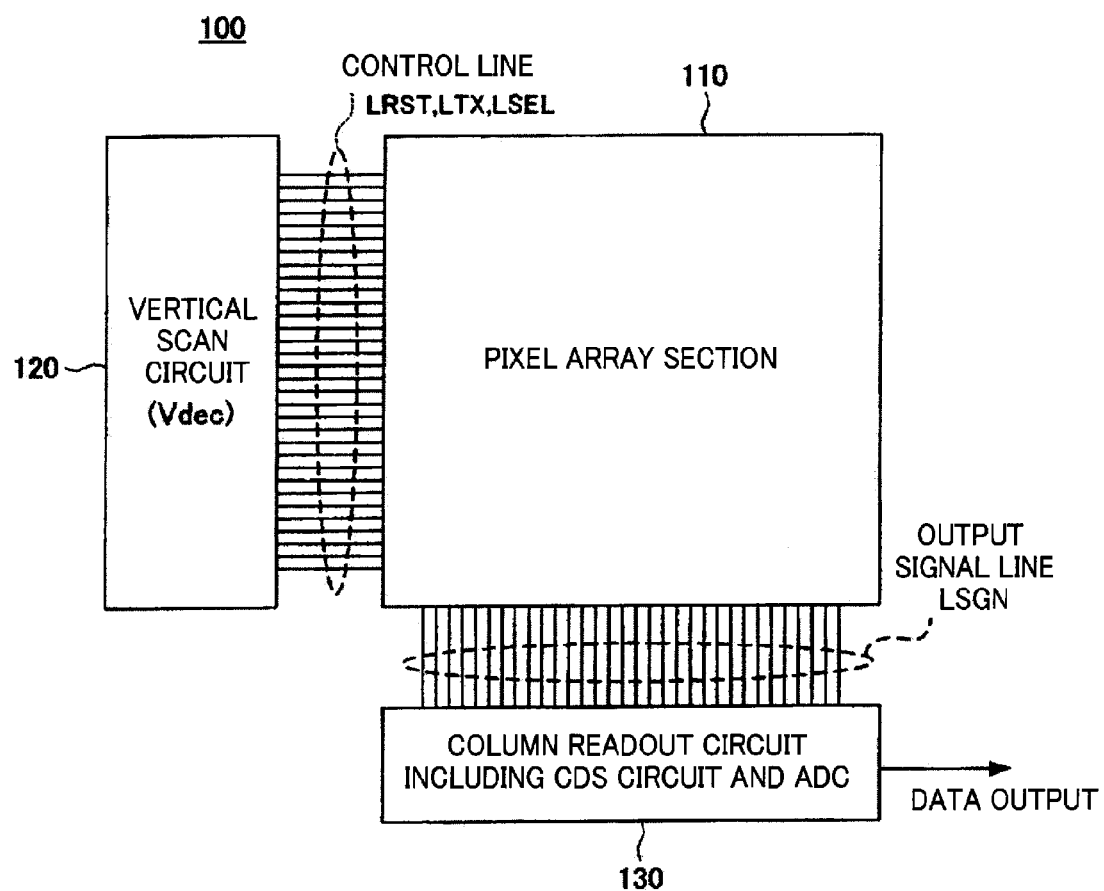
FIG. 4 is a diagram showing a structure example of the CMOS image sensor (a solid-state image pickup device) according to the embodiment of the present invention.

FIG. 4 is a diagram showing a structure example of the CMOS image sensor (a solid-state image pickup device) according to the first embodiment of the present invention.

The CMOS image sensor 100 includes a pixel array section 110, a vertical scan circuit (Vdec) 120 as a pixel driving section, and a column readout circuit 130 as a pixel signal readout section.

The pixel array section 110 arranges a plurality of pixels in two dimensional (a matrix).

Figure 5:
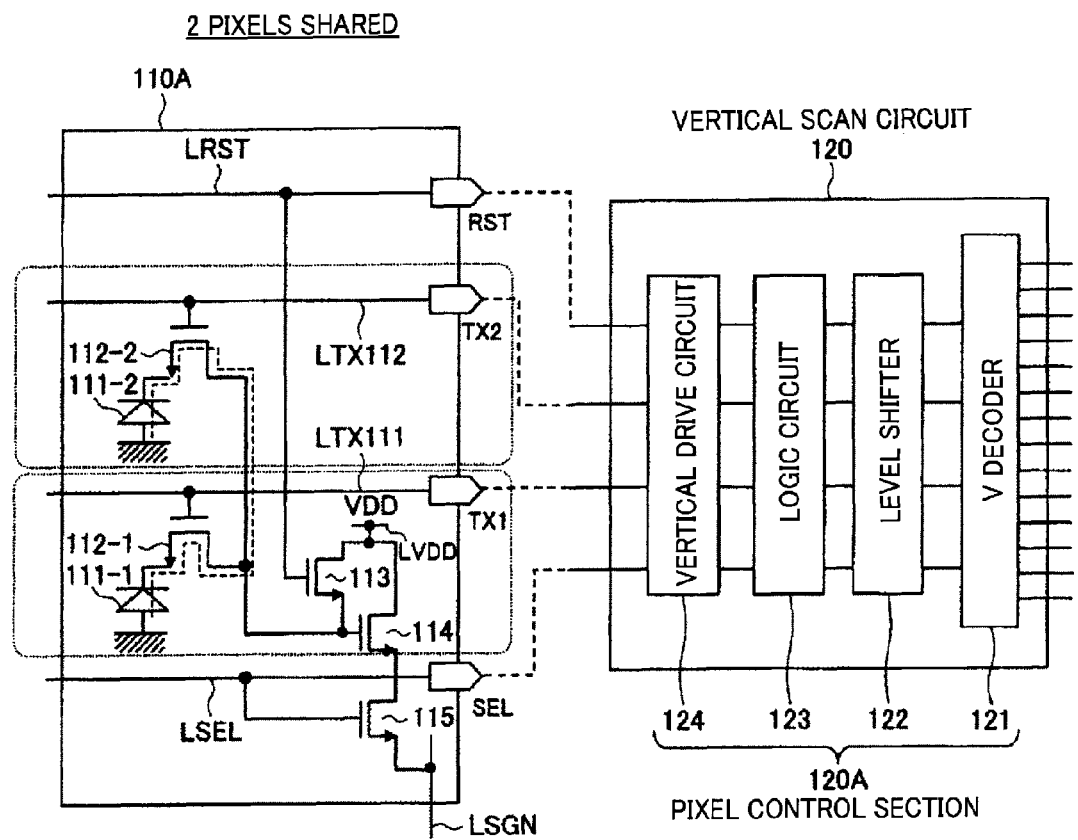
FIG. 5 is a diagram showing an example of pixels of the CMOS image sensor having a shared structure in two pixels according to the embodiment.

FIG. 5 is a diagram showing an example of pixels of the CMOS image sensor having a shared structure in two pixels according to the embodiment.

This pixel section 110A has, for example, photoelectric conversion elements 111-1, 111-2 composed of photo diodes (PD) (hereinafter, referred to as simply PD, in some cases).

And the pixel section 110A has transfer transistors 112-1, 112-2 with respect to each of photoelectric conversion elements 111-1, 111-2.

And in the pixel section 110A, a reset transistor 113, an amplifier transistor 114, and a selection transistor 115 are shared in two pixels.

The photoelectric conversion elements 111-1, 11102 photoelectrically convert incident lights into an amount of electric charge (as here, electron thereof) according to an amount of light thereof.

The transfer transistors 112-1, 112-2 are connected between the photoelectric conversion elements 111-1, 111-2 and a floating diffusion FD (hereinafter, referred to simply as FD, in some cases) as an output node.

The transfer transistors 112-1, 112-2 are given transfer signals TX1, TX2 which are control signals to gates thereof (transfer gates) via transfer control lines LTX111, LTX112.

This causes the transfer transistors 112-1, 112-2 transfer the electron photoelectric converted in the photoelectric conversion element 111 to the floating diffusion FD.

The reset transistor 113 is connected between a power supply line LVDD and the floating diffusion FD, and is to be given a reset signal RST, which is a control signal, to its gate through a reset control LRST.

Thus, the reset transistor 113 resets an electric potential of the floating diffusion FD to an electric potential VDD of the power supply line LVDD.

The floating diffusion FD is connected with a gate of the amplifier transistor 114. The amplifier transistor 114 is connected to a signal line LSGN through the selection transistor 115, and constitutes a source follower with a constant current source outside a pixel section.

And, a selection signal SEL, which is a control signal in accordance with an address signal, is to be given to the gate of the selection transistor 115 through a selection control line LSEL, and the selection transistor turns on.

When the selection transistor 115 is turned on, the amplifier transistor 114 amplifiers the electric potential of the floating diffusion FD, and outputs voltage to the signal line LSGN. The voltage outputted by each pixel is to be outputted to the column readout circuit 130 via the signal line LSGN.

These operations are performed for each pixel in one line at once, because each gate of the transfer transistor 112, the reset transistor 113, and the selection transistor 115 is connected in a unit of row, for example.

A reset control line LRST, transfer control lines LTX111, LTX112, and the selection control line LSEL are wired for each row unit of a pixel arrangement.

These reset control line LRST, the transfer control line LTX, and the selection control line LXEL are to be driven by the vertical scan circuit 120.

Thus, the pixel section 110A includes a pixel shared structure arranged with one reset control line LRST, and a plurality of the transfer lines LTX111, LTX112, having a readout pixel section and unread pixel section in its entirety.

The vertical scan circuit 120 controls an operation of pixel arranged in an arbitrary row in the pixel array section 110. The vertical scan circuit 120 controls pixels through the reset control line LRST, the transfer control lines LTX (111,112), and the selection control line LSEL.

The vertical scan circuit 120 includes, as shown in FIG. 5, a pixel control section 120A.

The pixel control section 120A fixes unread pixels normally in a reset state, and when reading readout pixels which are in a shared relationship, cancels the reset state of the unread pixels to turn into an unread state if the address is selected or the selection signal becomes active.

The pixel control section 120A includes a logic circuit that fixes unread pixels in a reset state, and that when reading readout pixels which are in a shared relationship, cancels the reset state of the unread pixels to turn into an unread state if the address is selected or the selection signal becomes active.

The logic circuit includes functions in which a logic gate is repeated in a cycle same as the cycle of shared pixels, and changes controls of readout pixels and unread pixels depending upon a connection relationship of the logic gate only.

The pixel control section 120A is connected to the transfer control line LTX, and the logic gate enabling readout and unread is formed in a combination of a plurality of logic circuits.

The pixel control section 120A is set so that a reset cancellation period and unread period of a transfer line of the unread pixels is set by a signal period of the selection control line LSEL, and a readout period of the transfer line of readout pixels are set to be within a period of the selection signal SEL of the selection control line LSEL.

The pixel control section 120A cancels the reset state of other pixels in a shared relationship to set an unread state by the logic gate when selected the address of the readout pixels.

Further, a combination logic gate is to be arranged on the same chip together with the pixel section.

Structure and function of the pixel control section 120A of this vertical scan circuit 120 will be explained later in detail.

The pixel control section 120A is configured, as shown in FIG. 5, for example, including a vertical (V) decoder 121, a level shifter 122, a logic circuit 123, and a vertical drive circuit 124.

In the pixel control section 120A, an address is decoded in the V decoder 121, the decoded signal receives a level shift effect of the level shifter 122 to be supplied to the logic circuit 123 including a logic gate.

The logic circuit 123 is configured so as to fix unread pixels in a reset state, and when reading readout pixels which are in a shared relationship, to cancel the reset state of the unread pixels to turn into an unread state if the address is selected or the selection signal becomes active.

Moreover, the vertical drive circuit 124 controls driving the reset control line LRST, the transfer control line LTX, and the selection control line LSEL depending on an operation state, following results of logical operation of the logic circuit 123.

The column readout circuit 130 receives data of pixel row in which a read operation is controlled by the vertical scan circuit 120 through an output signal line LSGN, and transfers it to a signal processing circuit in the post-stage.

The column read circuit 130 includes a CDS circuit or an ADC (analog-digital converter).

Hereinafter, a specific structure and functions of the pixel control section of the vertical scan circuit 120 according to the present embodiment will be described.

[First Structure Example of Pixel Control Section]

Figure 6:
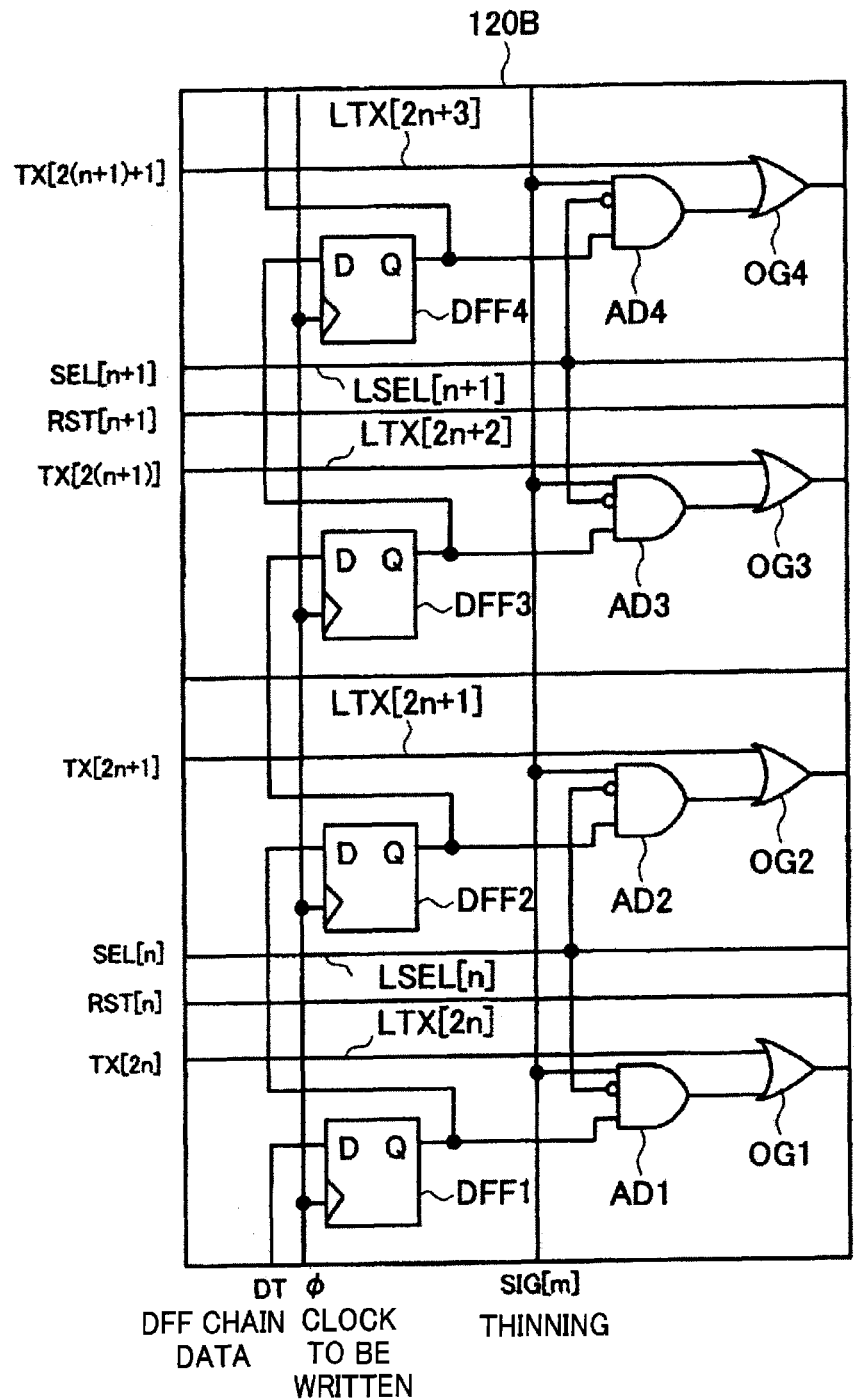
FIG. 6 is a circuit diagram showing a first structure example of a pixel control section of a vertical scan circuit according to the embodiment of the present invention.

FIG. 6 is a circuit diagram showing a first structure example of a pixel control section of a vertical scan circuit according to the embodiment of the present invention.

The pixel control section 120B in FIG. 6 includes D-type flipflop DFF1 to DFF4 as a plurality of latches, 3-input AND gates AD1 to AD4 as the first logic gates, and OR gates OG1 to OG4 as the second logic gates.

And the first logic gate and the second logic gate generate a logic gate section.

According to a thinning address determined by a required specification of a movie mode such as a frame rate, a thinning handling circuit which is fixed in hardwired (a blooming suppressor circuit) is generally configured for each address row.

By comparison, the pixel control section 120B in FIG. 6 is configured to handle an arbitrary thinning address and to be capable of changing in real time, by making address rows for thinning operation programmable using a DFF chain that is a latch chain section.

Write clock $\phi$ is supplied to clock terminals of DFF1 to DFF4. Data DT is supplied to a data input D of DFF 1, and output Q of DFF1 is connected to data input D of DFF(5) not shown in next stage.

Similarly, output Q of DFF2 is connected to data input D of DFF3 in the next stage, output Q is connected to data input D of DFF4 in the next stage, and output Q of DFF4 is connected to data input D of DFF(5) not shown in the next stage.

Thinned signal SIG[m] is supplied to the first input of AND gates AD1 to AD4. The second input of AND gates AD1 to AD4 are a negative input.

The second input of AND gates AD1 and AD2 are connected to a selection control line LSEL[n] that is a supplier line of the selection signal SEL[n].

The second input of AND gates AD3 and AD4 are connected to a selection control line LSEL[n+1] that is a supplier line of the selection signal SEL[n+1]

The third input of AND gate AD1 is connected to output terminal Q of flip-flop .DFF1. The third input of AND gate AD2 is connected to output terminal Q of flip-flop .DFF2. The third input of AND gate AD3 is connected to output terminal Q of flip-flop .DFF3. The third input of AND gate AD4 is connected to output terminal Q of flip-flop .DFF4.

The first input of OR gate OG1 is connected to output of AND gate AD1, and the second input is connected to a transfer control line LTX[2n] that is a supplier line of a transfer signal TX[n].

The first input of OR gate OG2 is connected to output of AND gate AD2, and the second input is connected to a transfer control line LTX[2n+1] that is a supplier line of a transfer signal TX[2n+1].

The first input of OR gate OG3 is connected to output of AND gate AD3, and the second input is connected to a transfer control line LTX[2n+2] that is a supplier line of a transfer signal TX[2n+2].

The first input of OR gate OG4 is connected to output of AND gate AD4, and the second input is connected to a transfer control line LTX[2n+3] that is a supplier line of a transfer signal TX[2n+3].

Figure 7:
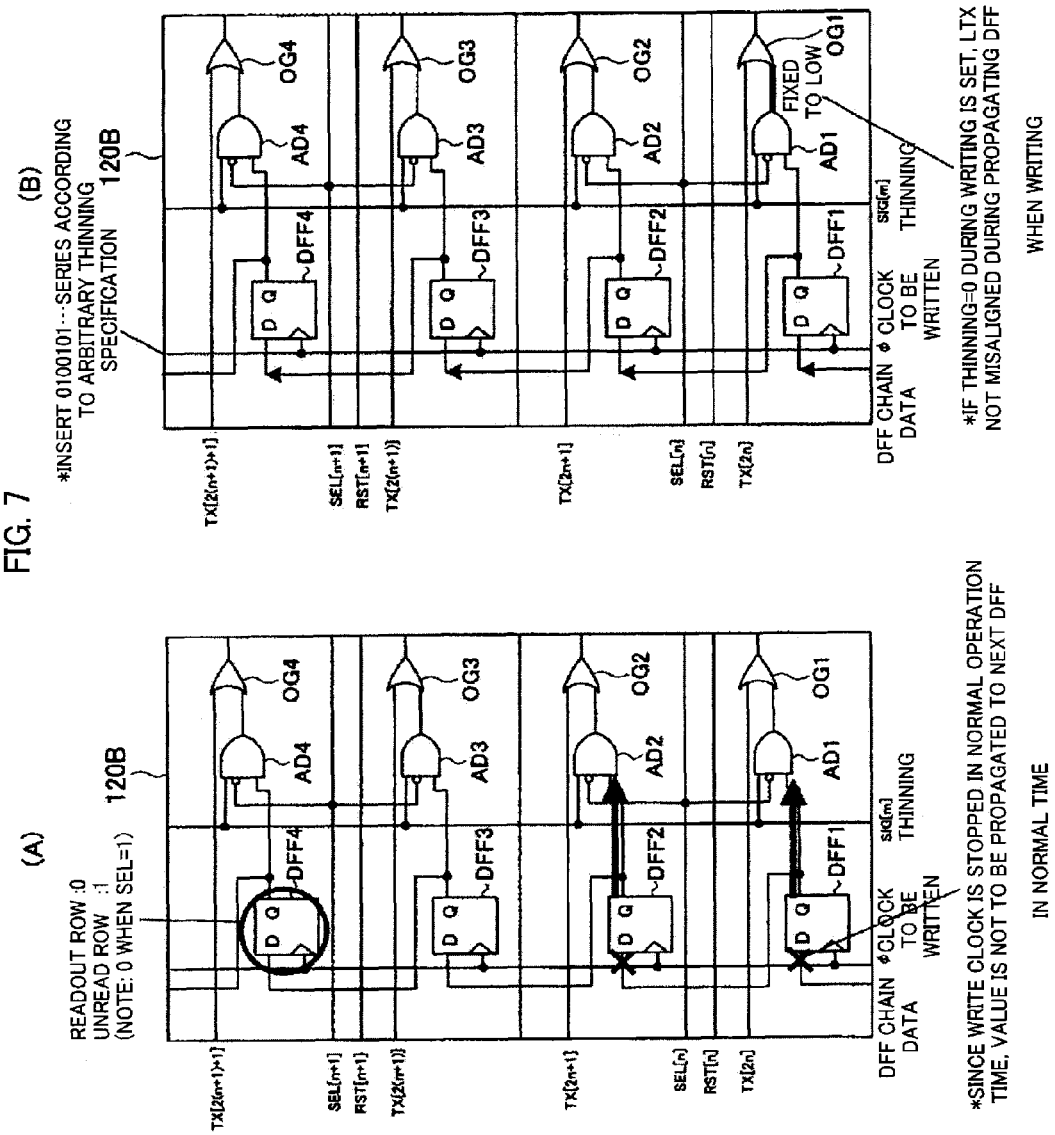
FIG. 7 is a diagram for explaining an operation of the pixel control section in FIG. 6.

FIGS. 7(A) and (B) are diagrams for explaining an operation of the pixel control section 120B in FIG. 6, and FIG. 7(A) is a diagram for explaining an operation in normal time, and FIG. 7(B) is for an operation when writing.

As shown in FIG. 7(A), whether a pixel is to read or unread is determined by a value (0 or 1) stored in any of DFF1 to DFF4.

This enables an arbitrary row to be switched into an operation to read or unread.

Flip-flops DFF1 to DFF4 have a chain structure, and are capable of operating in accordance with an arbitrary thinning address by flowing a 01 series for determining serially to read or unread in advance into the DFF chain.

As shown in FIG. 7(A), in normal operation, the write clock $\phi$ is stopped (fixed to a low level) and the flip-flops DFF1 to DFF4 output stored values from output terminal Q.

In this case, since the write clock $\phi$ is stopped, a memory value of flip-flop DFF in the next stage will not be propagated.

As shown in FIG. 7(A), in writing operation, a thinning signal SIG "m" is fixed to a low level, and the 01 series to read or unread in accordance with a thinning specification is transferred sequentially to DFF1 to DFF4.

Subsequently, in order to store one of series to a flip-flop DFF, an amount of time for the number of clock in V size is required. The write clock $\phi$ is controlled by a counter.

According to the pixel control section 120B in FIG. 6, it is possible to change into an arbitrary thinning mode, even in real-time, without changing hardware.

Further, a kind of thinning mode is possible to be extended unlimitedly in principle without changing a hardware depending upon series to be stored by DFF chain.

Taking advantage of a real time feature, it is possible to change a thinning operation finely for various operations in a setting side.

Determine a requirement specification is turned to be not necessary anymore primarily, and a level in which freedom in designing can be allowed would be advanced from hardware to software.

As the level allowing the freedom in designing advanced, a degree of freedom in determining specification is extended.

[Second Structure Example of Pixel Control Section]

Figure 8:
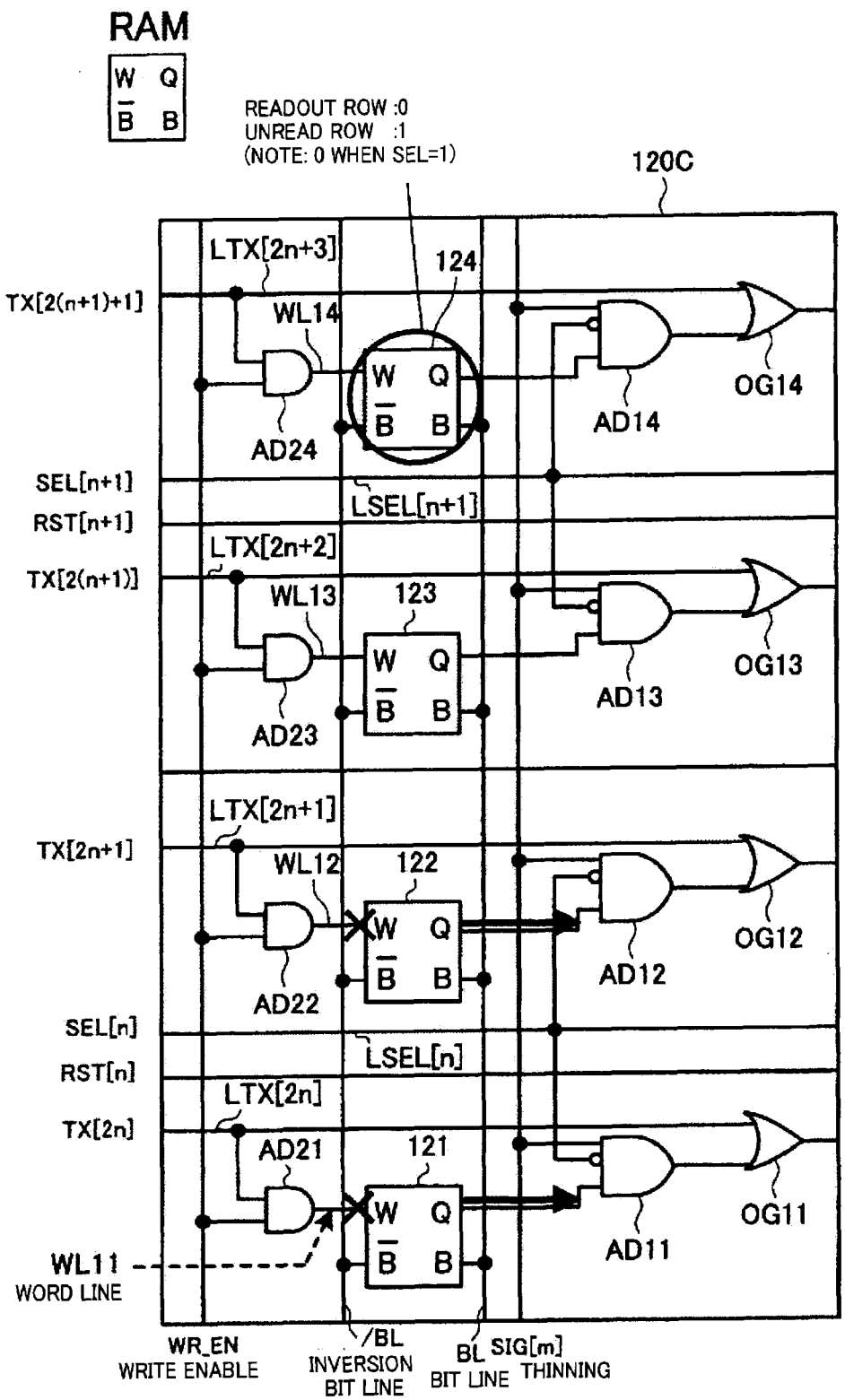
FIG. 8 is a circuit diagram showing a second structure example of a pixel control section of a vertical scan circuit according to the embodiment of the present invention.

FIG. 8 is a circuit diagram showing the second structure example of a pixel control section of a vertical scan circuit according to the embodiment of the present invention.

A pixel control section 120C in FIG. 8 includes RAM 121 to 124 as a plurality of memories, 3-input AND gates AD11 to AD14 and 2-input AND gates AD21 to AD24 as the first logic gates, and OR gates OG11 to OG14 as the second logic gates.

And the first logic gate and the second logic gate generate a logic gate section.

As described above, according to a thinning address determined by a required specification of a movie mode such as a frame rate, a thinning handling circuit which is fixed in hardwired (a blooming suppressor circuit) is generally configured for each address row.

By comparison, the pixel control section 120C in FIG. 8 is configured to handle an arbitrary thinning address and to be capable of changing in real time, by causing RAM121 to 124 to store address rows for thinning operation to be made programmable.

The pixel control section 120C determines whether a pixel is to read or unread by a value (0 or 1) stored in any of DFF1 to DFF4.

This enables the pixel control section 120C to make an arbitrary row to be switched into an operation to read or unread.

RAM 121 to 124 includes a connection section W with a word line WL, a connection section B with a bit line BL, a connection section /B with an inversion bit line /BL (/ indicates an inverse), and an output terminal Q.

The first input of AND gates AD21 to AD24 is connected to a supplier line of a write enable signal WRT_EN.

The second input of AND gate AD21 is connected to a transfer control line LTX[2n] that is a supplier line of the transfer signal TX[2n], and an output of AND gate AD21 is connected to a word line WL11. The word line WLL11 is connected to a connection section W of RAM 121.

The word line WL11 is driven in high level when the transfer signal TX[2n] is in high level and the write enable signal WRT_EN is active in high level.

The second input of AND gate AD22 is connected to a transfer control line LTX[2n+1] that is a supplier line of the transfer signal TX[2n+1], and an output of AND gate AD22 is connected to the word line WL12. The word line WLL12 is connected to a connection section W of RAM 122.

The word line WL12 is driven in high level when the transfer signal TX[2n+1] is in high level and the write enable signal WRT_EN is active in high level.

The second input of AND gate AD23 is connected to a transfer control line LTX[2n+2] that is a supplier line of the transfer signal TX[2n+2], and an output of AND gate AD23 is connected to the word line WL13. The word line WLL13 is connected to a connection section W of RAM 123.

The word line WL13 is driven in high level when the transfer signal TX[2n+2] is in high level and the write enable signal WRT_EN is active in high level.

The second input of AND gate AD24 is connected to a transfer control line LTX[2n+3] that is a supplier line of the transfer signal TX[2n+3], and an output of AND gate AD24 is connected to the word line WL14. The word line WLL114 is connected to a connection section W of RAM 124.

The word line WL14 is driven in high level when the transfer signal TX[2n+3] is in high level and the write enable signal WRT_EN is active in high level.

Thus, in the pixel control section 120C, the word lines WL11 to WL14 when to access to RAM 121 to 124 is configured so that transfer control line LTX[2n] to LTX[2n+3] can be utilized as they are when to readout a pixel.

That is, the pixel control section 120C is configured to take AND with the write enable signal WRT_EN so that it becomes effective to write into RAM 121 to 124 when transfer signals TX[2n] to TX[2n+3] is active in high level.

Thinned signal SIG[m] is supplied to the first input of AND gates AD11 to AD14. The second input of AND gates AD11 to AD14 is a negative input.

The second input of AND gates AD11 and AD12 are connected to a selection control line LSEL[n] that is a supplier line of the selection signal SEL[n]. The second input of AND gates AD13 and AD14 are connected to a selection control line LSEL[n+1] that is a supplier line of the selection signal SEL [n+1].

The third input of AND gate AD11 is connected to output terminal Q of RAM121. The third input of AND gate AD12 is connected to output terminal Q of RAM122. The third input of AND gate AD13 is connected to output terminal Q of RAM123. The third input of AND gate AD14 is connected to output terminal Q of RAM124.

The first input of OR gate OG11 is connected to output of AND gate AD11, and the second input is connected to a transfer control line LTX[2n] that is a supplier line of a transfer signal TX[n].

The first input of OR gate OG12 is connected to output of AND gate AD12, and the second input is connected to a transfer control line LTX[2n+1] that is a supplier line of a transfer signal TX[2n+1].

The first input of OR gate OG13 is connected to output of AND gate AD13, and the second input is connected to a transfer control line LTX[2n+2] that is a supplier line of a transfer signal TX[2n+2].

The first input of OR gate OG14 is connected to output of AND gate AD14, and the second input is connected to a transfer control line LTX[2n+3] that is a supplier line of a transfer signal TX[2n+3].

Here, a structure example of RAM and its write circuit will be explained.

Figure 9:
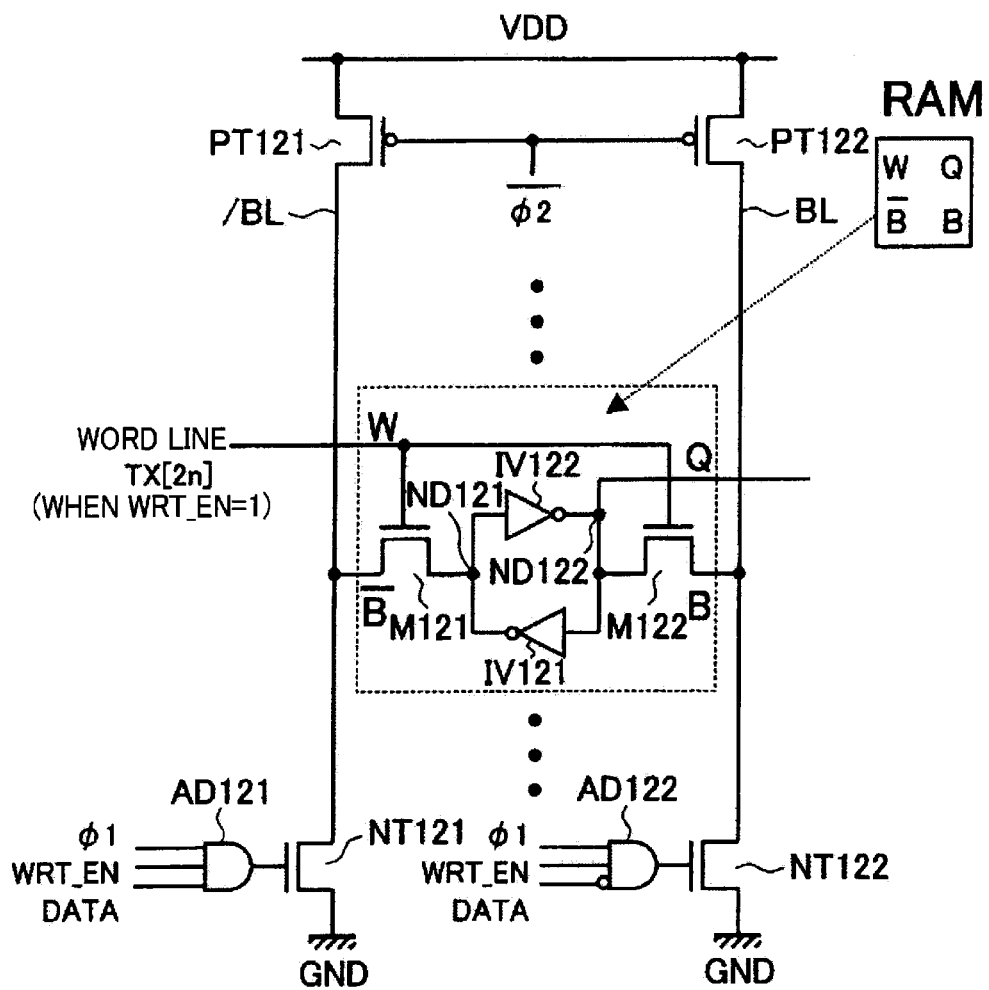
FIG. 9 is a circuit diagram showing a structure example of a RAM and a write circuit thereof in FIG. 8.
Figure 10:
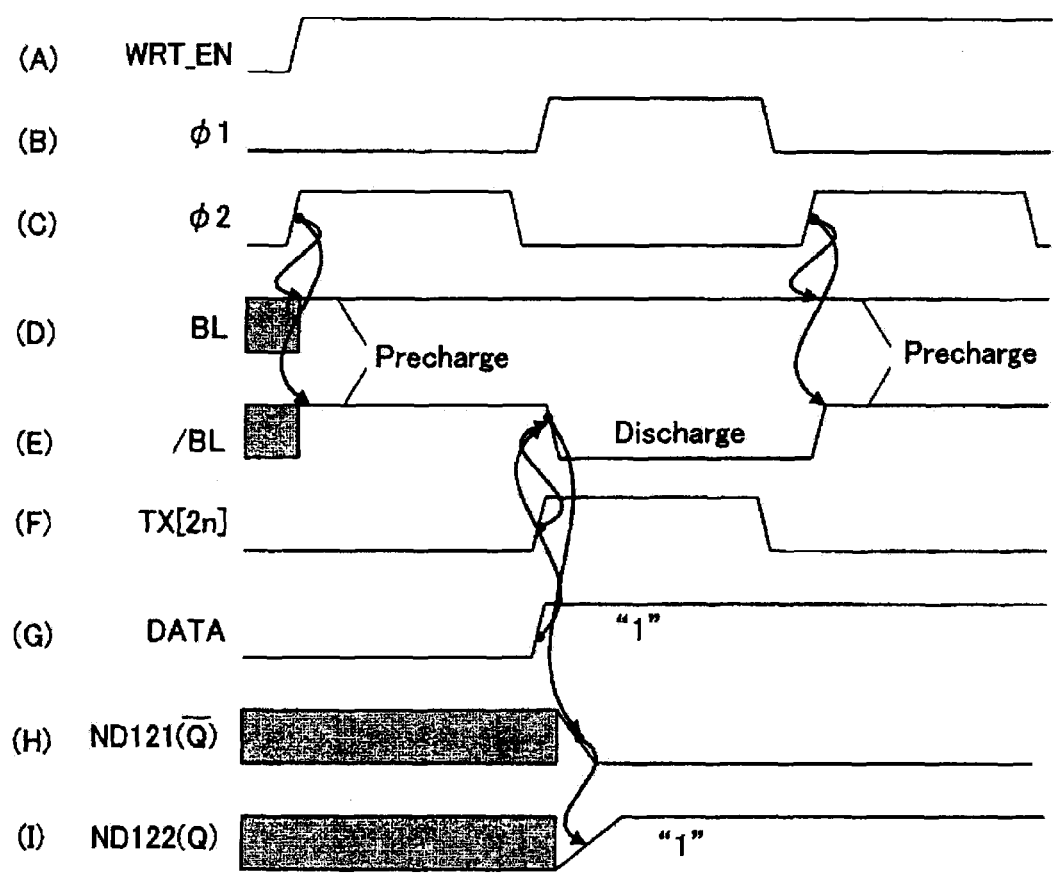
FIG. 10 is a timing chart for explaining operations of the pixel control section in FIG. 8 and FIG. 9.

FIG. 9 is a circuit diagram showing the structure example of RAM and the write circuit thereof.

[Structure Example of RAM]

RAM(121 to 124) are, for example, configured by a static RAM (SRAM).

RAM in FIG. 9 includes inverters IV121, IV122, access transistors M121, M122, nodes ND121, ND122, connection sections W, B, and /B, and an output terminal Q.

An output of the inverter IV121 and an input of the inverter IV122 are connected, and its connecting point forms the node ND121. An output of the inverter IV122 and an input of the inverter IV121 are connected, and its connecting point forms the node ND122.

This node ND 122 is connected to the output terminal Q.

The access transistors M121, M122 are, for example, formed by n-channel MOS (NMOS) transistors.

Source and drain of the access transistor M121 are connected to the node ND 121 and an inverse bit line /BL. A connection point of the access transistor M121 and an inverse bit line /BL forms a connection section ./B.

Source and drain of the access transistor M122 are connected to the node ND 122 and a bit line /BL. A connection point of the access transistor M122 and a bit line /BL forms a connection section ./B.

And gates of the access transistors M121, M122 are connected to the word line WL through the connection section W.

In the RAM having such structure, since a write enable signal WRT EN is non-active in low level in normal operation, the access transistors M121 and M122 are in an off state, keeping outputting a memory value from the output terminal Q.

[Structure Example of Write Circuit of RAM]

Hereinafter, an explanation will be given on a write circuit of RAM.

The write circuit of RAM includes, as shown in FIG. 9, NMOS transistors NT121, NT122, p-channel MOS (PMOS) transistors PT121, PT122, and 3-input AND gates AD121, AD122.

A source of the NMOS transistor NT121 is grounded, a drain is connected to one end side of the inverse bit line /BL. The drain of the PMOS transistor PT121 is connected to another end side of the inversion bit line /BL, and the source of the PMOS transistor PT121 is connected to a supplier line of a power source VDD.

A source of the NMOS transistor NT122 is grounded, a drain is connected to one end side of the bit line BL. The drain of the PMOS transistor PT122 is connected to another end side of the bit line BL, and the source of the PMOS transistor PT 122 is connected to a supplier line of a power source VDD.

A gate of the NMOS transistor NT121 is connected to an output of AND gate AD121. A gate of the NMOS transistor NT122 is connected to an output of AND gate AD122.

Moreover, gates of the PMOS transistors PT121 and PT122 are connected to a supplier line of an inverse signal /$\phi$2 of a clock signal $\phi$2.

The first input of 3-input AND gate AD121 is connected to a supplier line of DATA, which is a memory value data (0 or 1) to be written into RAM. The second input of AND gate AD121 is connected to a supplier line of the write enable signal WRT_EN, and the third input is connected to a supplier line of a clock signal $\phi$1.

The first input which is a negative input of 3-input AND gate AD122 is connected to a supplier line of DATA, which is a memory value data (0 or 1) to be written into RAM. The second input of AND gate AD122 is connected to a supplier line of the write enable signal WRT_EN, and the third input is connected to a supplier line of a clock signal $\phi$1.

FIG. 10(A) to (I) are timing charts for explaining operations of the pixel control section 120C in FIG. 8 and FIG. 9.

Here, a case where to access to the RAM121 will be explained.

FIG. 10(A) indicates the write enable signal WRT_EN, FIG. 10(B) indicates the clock signal φ1, FIG. 10(C) indicates the clock signal φ2, FIG. 10(D) indicates an electric potential of the bit line BL, and FIG. 10(E) indicates an electric potential of the inverse bit line /BL, respectively.

FIG. 10(F) indicates the transfer signal TX[2n] that is propagated through a transfer control section LTX[2n], FIG. 10(G) indicates a memory value data DATA, FIG. 10(H) indicates a level of the node ND 121, and FIG. 10(I) indicates a level (output value) of the node ND 122, respectively.

On normal operation, the write enable signal WRT_EN is set to low level (logic 0), and the word line WLL11 becomes low level by AND gate 21.

As the result, since the access transistors M121, M122 of RAM 121 is in a state of off, RAM 121 keeps outputting a value stored in the node ND 122 that is an interval loop from the output terminal Q.

When writing, the write enable signal WRT_EN is set to high level (logic 1).

At first, the clock signal φ2 is set to high level for a predetermined period, its inverse signal φ2 becomes low level and the PMOS transistors PT121, PT122 turns on. This enables the bit line BL and the inverse bit line /BL are once precharged to high level (VDD level). the word line WLL11 becomes low level by AND gate 21.

Next, synchronizing with the clock signal φ1, a high level of the transfer signal TX[2n] is transferred to the transfer control line LTX[2n] of a row preferable to be accessed, and the word line WLL11 becomes high level by AND gate 21.

As the result, the access transistors M121, M122 of RAM 121 becomes a state of on.

At this time, depending on value of the memory value data DATA to be written, more specifically, depending on whether logic 0 or 1, either any of the NMOS transistors NT 121 or NT 122 turns on. This causes the bit line BL or the inverse bit line /BL, to which the transistor turned on is connected, is to be discharged and to fall into low level.

Data level of the bit line BL or the inverse bit line /BL which has fallen into low level is transmitted to the node ND122 or ND121 via the access transistors M122, M121, and its value will revise a value of RAM121.

Here, as shown in FIG. 10(G), since the memory value data DATA is "1", the NMOS transistor NT121 of a write circuit turns on, and the inverse bit line /BL is to be discharged and to fall into low level.

Associating with this inverse bit line /BL that has fallen into low level, the node ND121 is to be discharged through the inverse bit line /BL, the access transistor M121 of RAM 121, and the node ND121 becomes low level. As the result, the node ND122 becomes high level, and data 1 is to be written.

Synchronizing the clock signal φ1, the transfer signal TX[2n] becomes low level, and the word line WLL11 becomes low level by AND gate 21.

As the result, the access transistors M121, M122 of the RAM121 turns off, writing is completed, and subsequently a precharge operation for writing another row is continued.

According to the pixel control section 120C in FIG. 8 and FIG. 9, similar to the pixel control section 120B in FIG. 6, it is possible to change into an arbitrary thinning mode, even in real-time, without changing hardware.

Further, a kind of thinning mode is possible to be extended unlimitedly in principle without changing a hardware depending upon series to be stored by DFF chain.

Taking advantage of a real time feature, it is possible to change a thinning operation finely for various operations in a setting side.

Determine a requirement specification is turned to be not necessary anymore primarily, and a level in which freedom in designing can be allowed would be advanced from hardware to software.

As the level allowing the freedom in designing advanced, a degree of freedom in determining specification is extended.

Especially, according to the pixel control section 120C in FIG. 8 and FIG. 9, since functions for specifying address is utilized as it is for write access to RAM in a V decoder, only small amount of hardware needs to be added.

The second structure example uses RAM, however, it should not be limited to RAM in particular, but any storage device is satisfactory. For example, a latch, etc may be appropriate.

Moreover, there may be a case to store rows subject to be thinned, in reverse, there may be a case to store rows subject to be readout.

Specification of a storage device subject to perform storing operation is performed by an output signal of a circuit for specifying a row where a readout operation or a reset operation is executed, or by a signal generated by an output from the circuit.

[Third Structure Example of Pixel Control Section]

Figure 11:
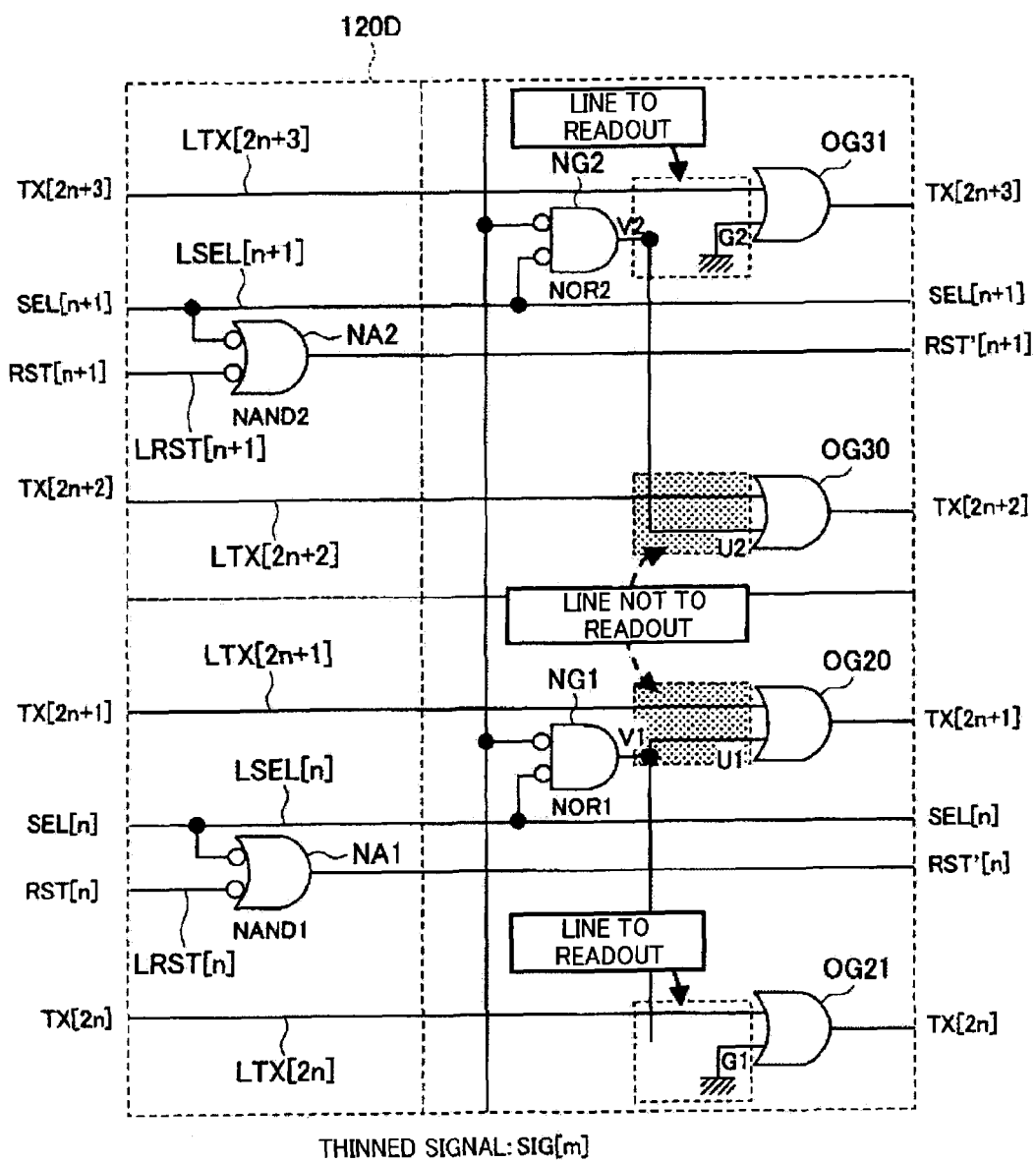
FIG. 11 is a circuit diagram showing a third structure example of a pixel control section of a vertical scan circuit according to the embodiment of the present invention.

FIG. 11 is a circuit diagram showing a third structure example of a pixel control section of a vertical scan circuit according to the embodiment of the present invention.

In FIG. 11, a structure example in which a logic gate is arranged between a readout row and unread row so that a reset state of an unread pixel can be cancelled without a complex circuit structure when an address is selected or a selection signal becomes active in a primary part of a circuit structure.

In other words, FIG. 11 shows a structure example of a shutter drive for preventing blooming.

The pixel control section 120D in FIG. 11 includes NAND gates NA1, NA2, NOR gates NG1, NG2, OR gates OG20, OG21, and OR gates OG30, OR31.

The first input of NAND gate NA1 is connected to a reset control line LRST [n] that is a supplier line of a reset signal RST[n], and the second input is connected to a selection control line LSEL[n] that is a supplier line of the selection signal SEL [n].

The first input of NAND gate NA2 is connected to a reset control line LRST [n+1] that is a supplier line of a reset signal RST[n+1], and the second input is connected to a selection control line LSEL[n+1] that is a supplier line of the selection signal SEL[n+1].

The first input of NOR gates NG1 and NG2 are connected to a supplier line of the thinning signal SIG[m].

The second input of NOR gate NG1 is connected to a selection control line LSEL[n] that is a supplier line of the selection signal SEL[n].

The second input of NOR gate NG2 is connected to a selection control line LSEL[n+1] that is a supplier line of the selection signal SEL[n+1].

The first input of OR gate OG20 is connected to a transfer control line LTX [2n+1] that is a supplier line of the transfer signal TX[2n+1], and the second input is connected to an output of NOR gate NG1.

The first input of OR gate OG21 is connected to a transfer control line LTX [2n] that is a supplier line of the transfer signal TX[2n], and the second input is grounded.

The first input of OR gate OG30 is connected to a transfer control line LTX [2n+2] that is a supplier line of the transfer signal TX[2n+2], and the second input is connected to an output of NOR gate NG2.

The first input of OR gate OG31 is connected to a transfer control line LTX [2n+3] that is a supplier line of the transfer signal TX[2n+3], and the second input is grounded.

FIG. 12 shows circuits and operation functions indicating in groups in MIL logic symbols related to FIG. 11.

Here, how to thin is prescribed in advance, and as shown in the figure, the most bottom row of TX'[2n] and the most upper row of TX'[2n+3] are determined as a row to be readout.

On the contrary, row of TX'[2n+1] and row of TX'[2n+2] are configured in 2 pixels shared structure that shares between 2 pixels in the upper side, and between 2 pixels in the bottom side so that row of TX'[2n+1] and TX'[2n+2] becomes unread row.

Now, to indicate a logic circuit in MIL symbols, the most bottom readout row in the figure, 2n, is connected to OR gate OG21, and the most upper readout row, TX[2n+3], is connected to OR gate OG31.

Row of TX[2n+1] and row of TX[2n+2], which are unread rows, are connected to OR gates OG20 and OG30 respectively.

One side of input of OR gate OG21 is the transfer signal TX[2n], if the other input is grounded and when the transfer signal TX[2n] is high level "H(active)", nothing would be happen and go through as it is since it is also grounded at "OR gate TG21". For this reason, output TX'[2n] also becomes high level "H(active)" to be in a state of readout.

The transfer control line of this row is to be controlled normally.

In contrast, one side of input of OR gate OG20 is the transfer signal TX [2n+1], and the other input is supplied with an output V1 of the NOR gate NG1.

And one side of input of the NOR gate NG1 is further connected to a supplier line of the thinning signal SIG[m], and forms a negative logic input section together with the other side of the input section that is connected to the selection control line LSEL[n].

The latter is further arranged between SEL[n] and TX[2n], forms one side of the input section of NAND gate NA1 that has RST'[n] in an output section, and forms the negative logic input section together with the other side of input RST[n] of NAND gate NA1.

When the reset signal RST[n] is high level "H", if the selection signal SEL[n] is set to high level "H", the output reset signal RST'[n] becomes low level "L", and the reset fixing is cancelled.

At this time, the selection signal SEL[n] in high level "H" is input into one side of input of NOR gate NG1, and the thinning signal SIG[m] is input to the other side of input.

For this reason, when the thinning signal SIG[m] is high level "H", the output V1 is low level "L", and when the input TX[2n+1] of OR gate OG20 is low level "L", the output TX'[2n+1] becomes low level "L".

In other words, row of TX'[2n+1] becomes in a state of unread.

Similarly, one side of input of OR gate OG31 is a transfer signal TX[2n+3], if the other side of input is grounded, when the transfer signal [2n+3] is always high level "H(active)", output TX'[2n+3] becomes high level "H" and in a state of readout.

In contrast, one side of input of OR gate OG30 is the transfer signal TX [2n+2], and the other input is supplied with an output V2 of the NOR gate NG2.

One side of input of the NOR gate NG2 is supplied with the thinning signal SIG[m], and forms a negative logic input section together with the other side of the input section that is connected to the selection control line LSEL[n+1].

The latter further forms one side of input section of NAND gate NA2 arranged between itself and the reset control line LRST'[n+1], and forms the negative logic input section together with the other side of input RST[n+1] of NAND gate NA2.

When the reset signal RST[n+1] is high level "H", if the selection signal SEL[n+1] is set to be high level "H", the output reset signal RST'[n+1] becomes low level "L", and reset fixing is cancelled.

At this time, since the selection signal SEL[n+1] in high level "H" is input into one side of input of NOR gate NG2, and the thinning signal SIG[m] is input to the other side of input, therefore, if the signal is high level "H", the output V2 becomes low level "L".

When the input TX[2n+2] of OR gate OG30 is low level "L", the output TX'[2n+2] becomes low level "L".

Therefore, row of TX'[2n+2] becomes in a state of unread.

Note that in the embodiment of the present invention, a combination logic circuit to constitute a logic gate is OR circuit, NOR circuit, and HAND circuit, however, if it is a circuit that realizes the operation described above, it is not necessarily limited to them.

FIG. 13(A) to (G) is a diagram showing a timing chart of a circuit in FIG. 11.

Figure 2:
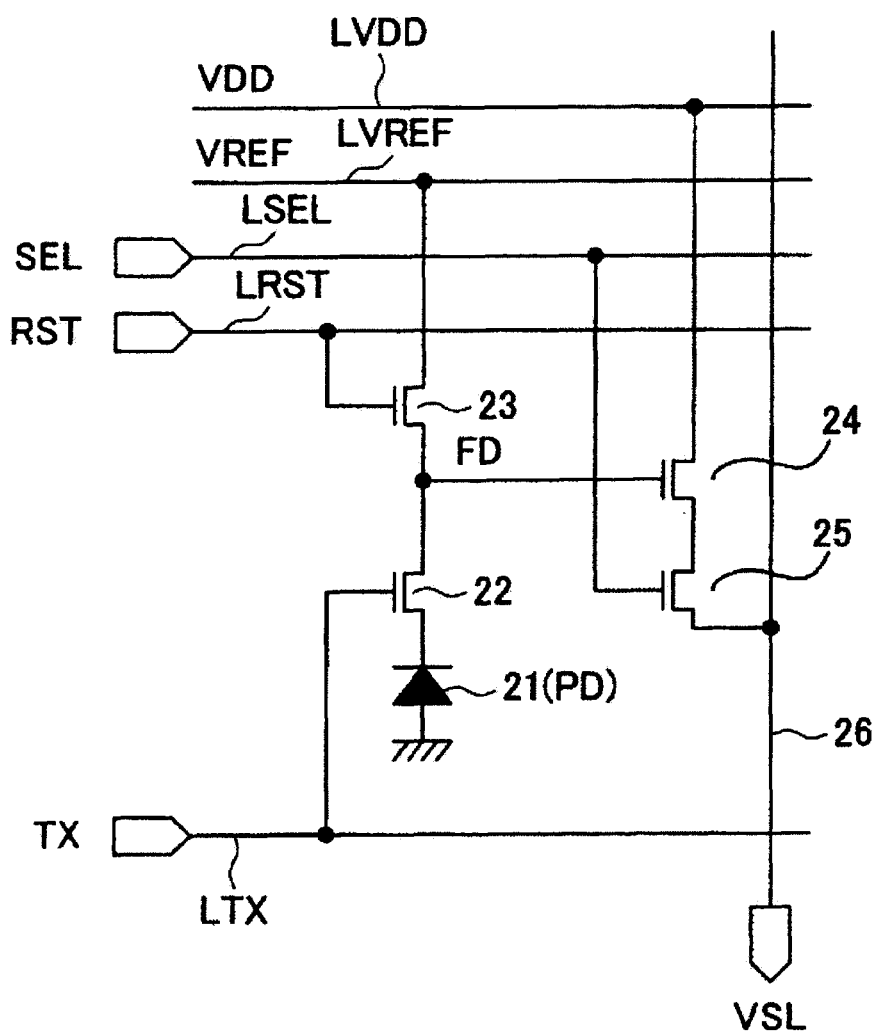
FIG. 2 is a diagram showing an example of pixel of the CMOS image sensor configured by four transistors.
Figure 3:
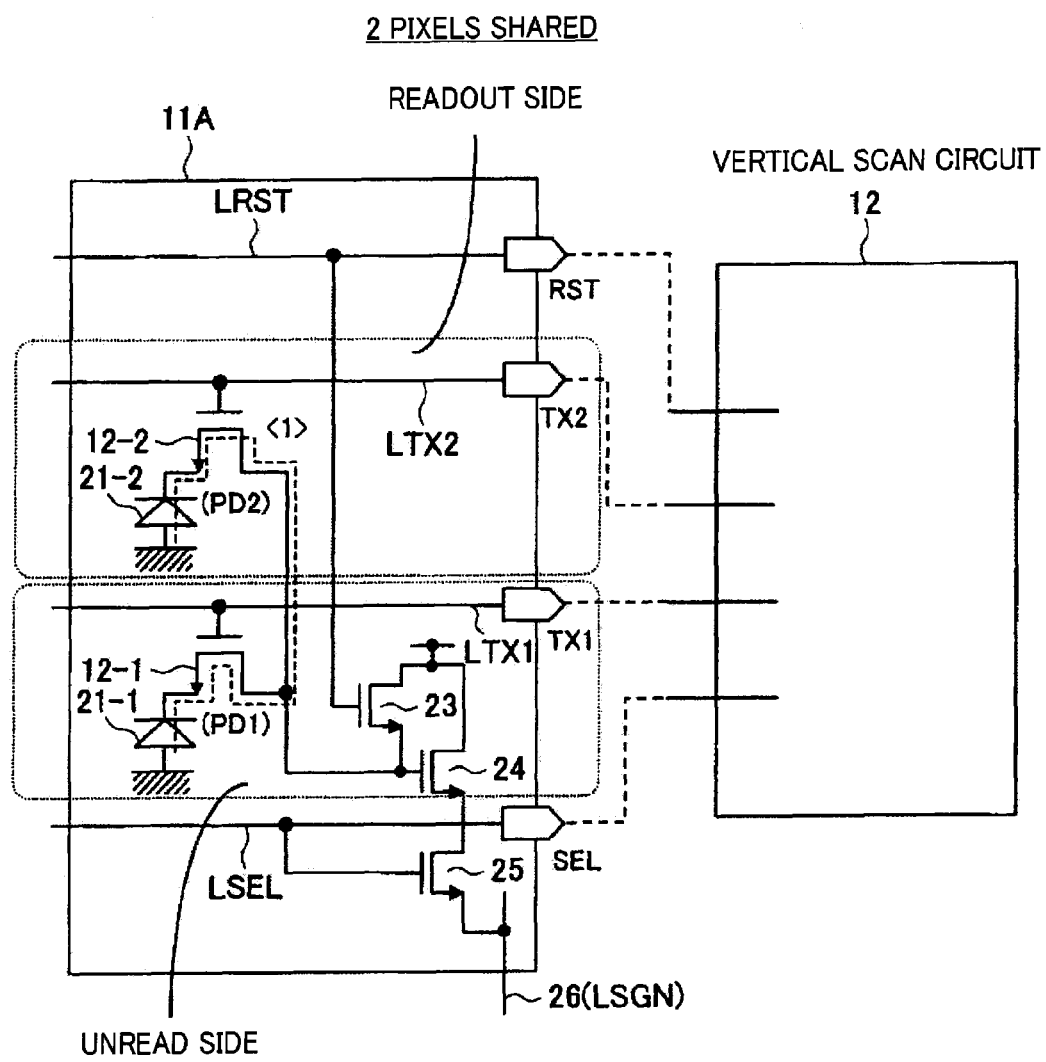
FIG. 3 is a conceptual diagram showing a structure of the CMOS image sensor which adapted a thinning and reading method, in case of 2 pixels shared.

FIG. 13(A) to (G) illustrates timing charts about a pair of a readout row and an unread row in the lower part of FIG. 2.

Figure 13:
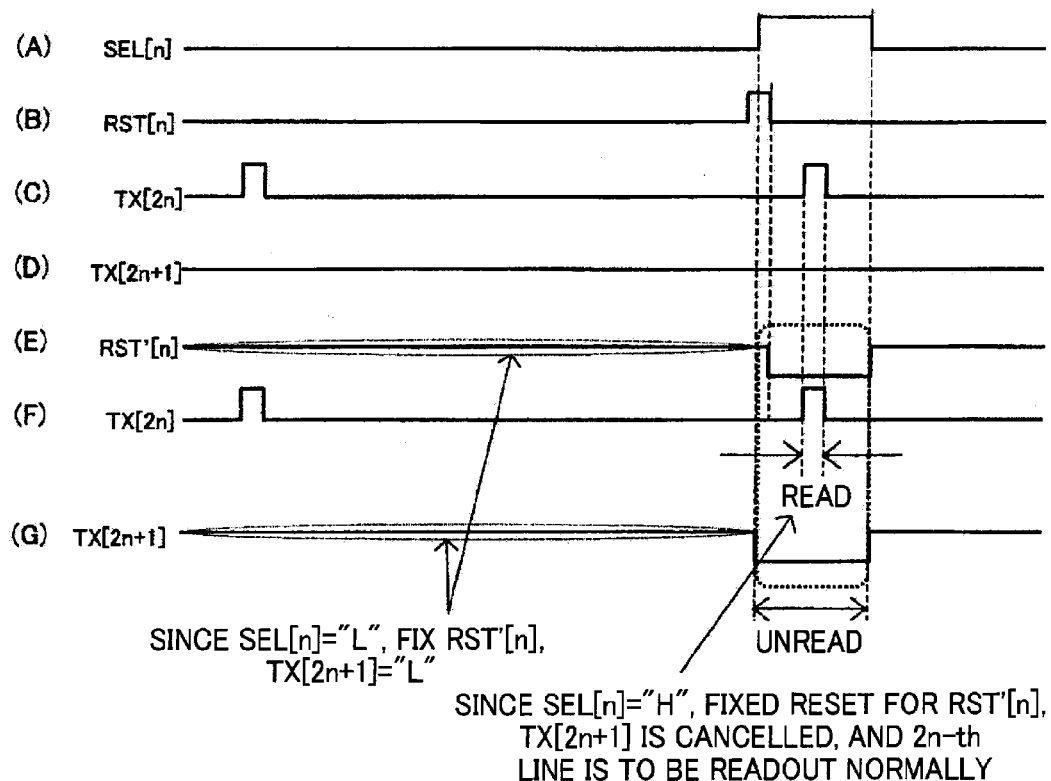
FIG. 13 is a diagram showing a timing chart of a circuit in FIG. 11.

FIG. 13(A) illustrates the selection signal SEL[n], FIG. 13(B) illustrates the reset signal RST[n], FIG. 13(C) illustrates a transfer signal TX[2n], and FIG. 13 illustrates the transfer signal TX[2n+1] respectively.

Regarding the row of TX[2n], since one side of the input section of OR gate OG21 is grounded, the input signal on left side goes through as it is to the right side to become the transfer signal TX'[2n].

During the period while the selection signal SEL[n] is high level "H", high level "H" is cancelled from the reset signal RST[n], row of TX'[2n] becomes high level "H", and a readout row.

On the contrary, a reset fixing is also cancelled from the row of TX'[2n+1], becomes low level "L" during this period, and row of TX'[2n+1] is fixed to low level "L" in an unread state.

Next, a structure example of driving the blooming suppressing shutter in a case of four pixels shared.

Figure 14:
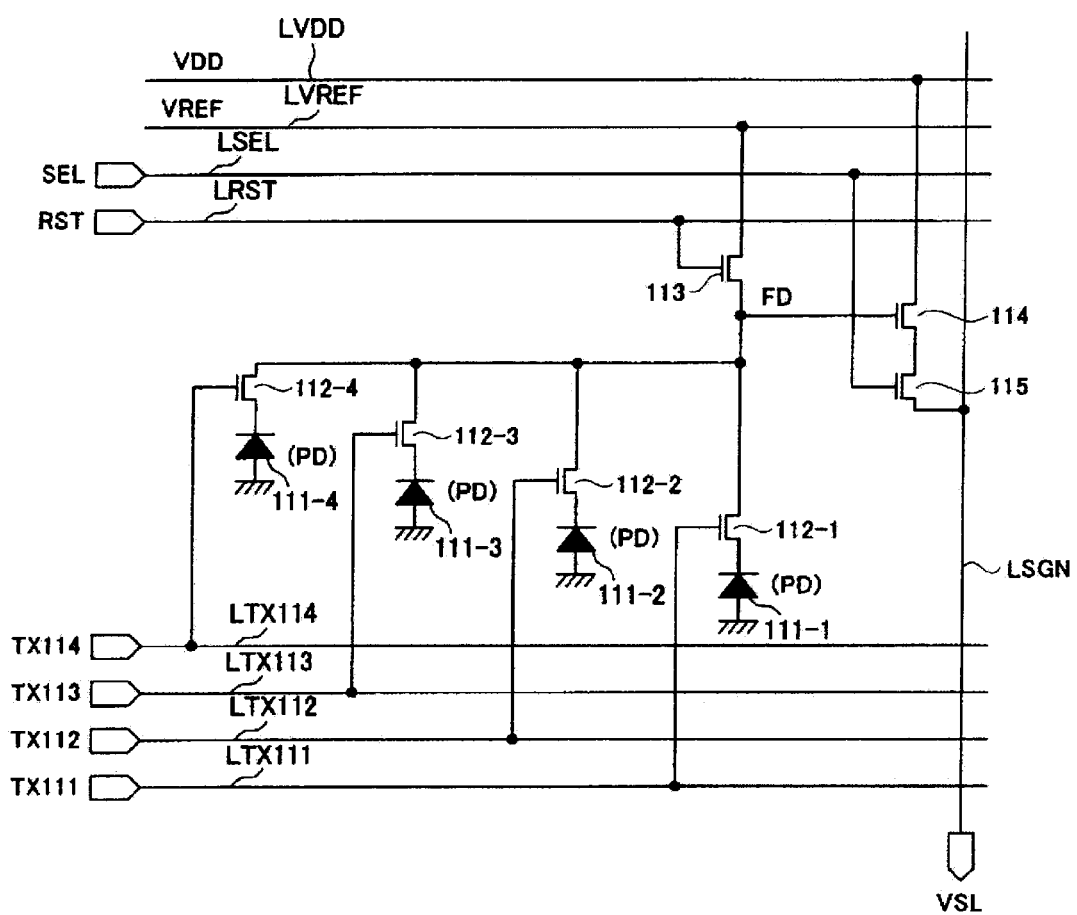
FIG. 14 is a diagram showing a structure example of four pixels shared.

FIG. 14 is a diagram showing a structure example of four pixels shared.

In FIG. 14, for easier understanding, structure parts same as FIG. 5 is shown in the same reference signs.

Figure 15:
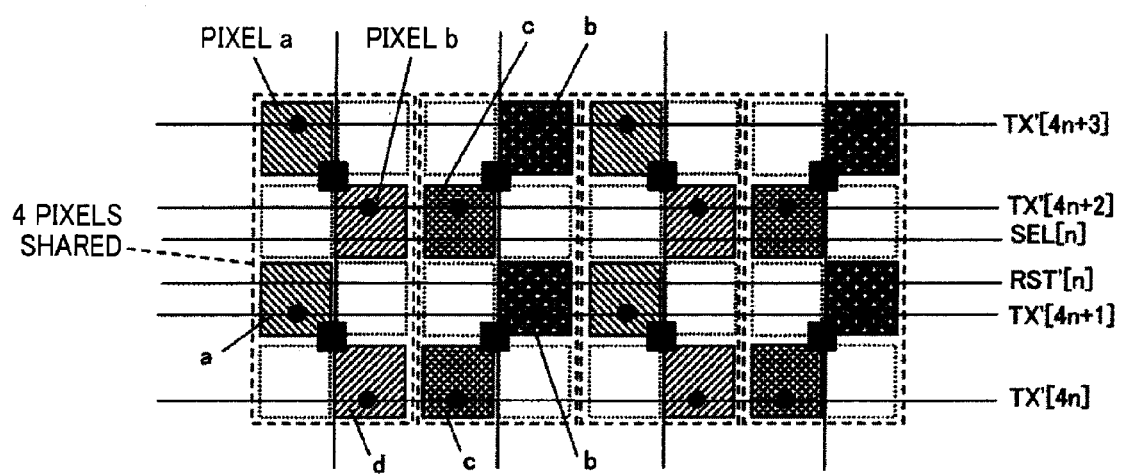
FIG. 15 is a diagram showing an example of pixel arrangement in case of four pixels shared.

FIG. 15 is a diagram showing an example of pixel arrangement in case of four pixels shared.

In the example of FIG. 15, four pixels are shared so that pixel a and pixel d are repeated in zigzag manner in column direction, and pixel b and pixel c are repeated in the next column in column direction, sharing four pixels respectively in longitudinal direction.

Each unit of sharing is overlapped in horizontal direction, one unit of sharing is in horizontal direction, and the selection control line LSEL[n], the reset control line LRST[n] are shared.

It shows a state where four of the transfer control line TX'[4n], TX'[4n+1], TX'[4n+2], TX'[4n+3] are arranged corresponding to each respective pixel in a unit.

[Fourth Structure Example of Four Pixels Shared]

Figure 16:
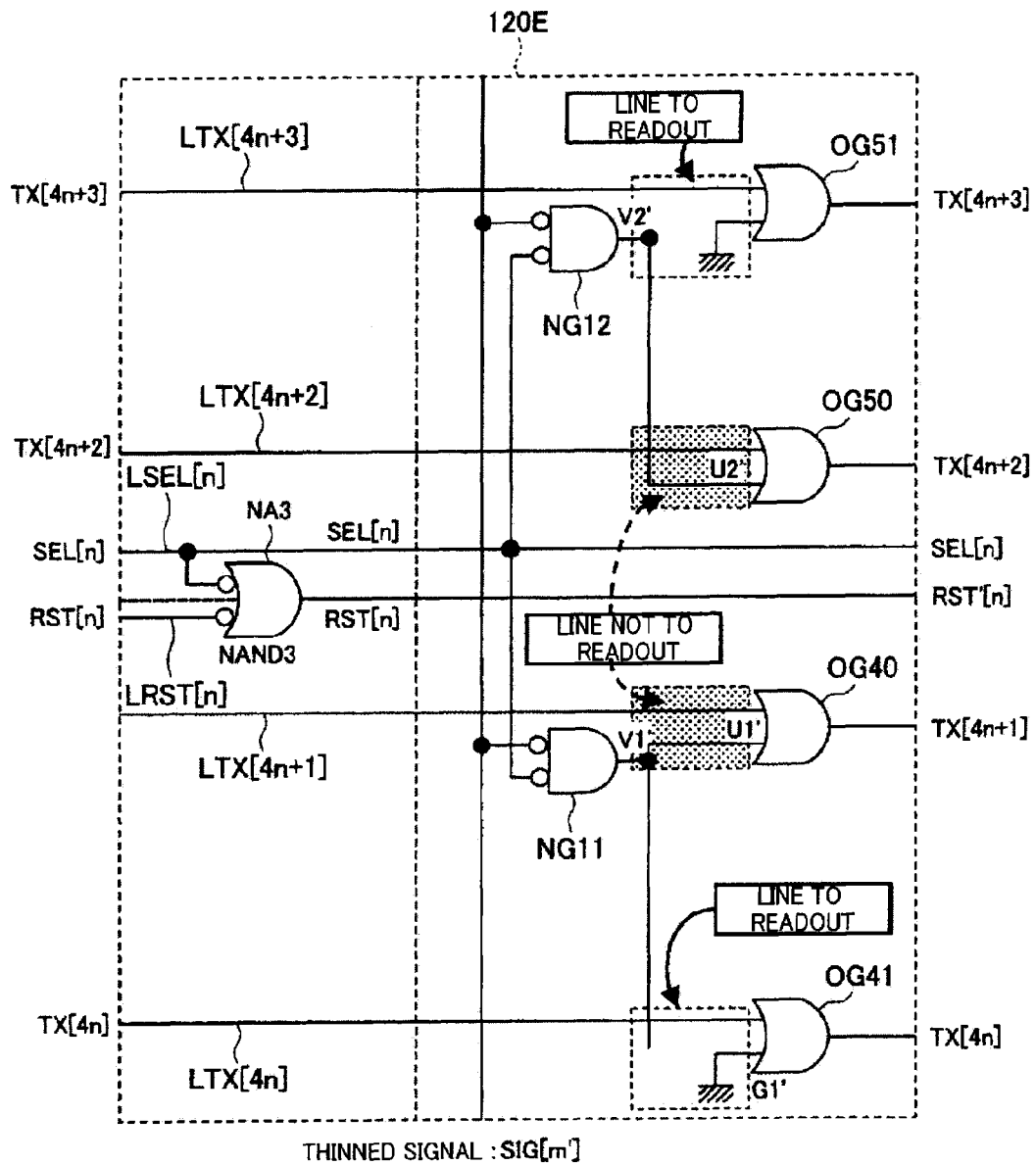
FIG. 16 is a circuit diagram showing a fourth structure example of a pixel control section of a vertical scan circuit according to the embodiment of the present invention.

FIG. 16 is a circuit diagram showing a fourth structure example of a pixel control unit of a vertical scan circuit according to the embodiment of the present invention.

FIG. 16 shows how logic gate composed of a plurality of logic circuits is applied for executing "read" and "unread" with respect to each of the plurality of transfer lines in response to supplying four pixels.

The pixel control section 120E in FIG. 16 includes a NAND gate NA3, a NOR gate NG11, NG12, OR gate OG40, OG41, and OR gates OG40, OR51

The first input of NAND gate NA3 is connected to a reset control line LRST [n] that is a supplier line of a reset signal RST[n], and the second input is connected to a selection control line LSEL[n] that is a supplier line of the selection signal SEL [n].

The first input of NOR gates NG1 and NG12 are connected to a supplier line of the thinning signal SIG[m'].

The second input of NOR gate NG11 and NG12 is connected to a selection control line LSEL[n] that is a supplier line of the selection signal SEL[n].

The first input of OR gate OG40 is connected to a transfer control line LTX [4n+1] that is a supplier line of the transfer signal TX[4n+1], and the second input is connected to an output of NOR gate NG11.

The first input of OR gate OG41 is connected to a transfer control line LTX [4n] that is a supplier line of the transfer signal TX[4n], and the second input is grounded.

The first input of OR gate OG50 is connected to a transfer control line LTX [4n+2] that is a supplier line of the transfer signal TX[4n+2], and the second input is connected to an output of NOR gate NG12.

The first input of OR gate OG51 is connected to a transfer control line LTX[4n+3] that is a supplier line of the transfer signal TX[4n+3], and the second input is grounded.

In the structure of FIG. 16, the transfer control lines LTX [4n] and LTX[4n+3], which are readout rows, are connected to OR gates OG41 and OG51 respectively, and one side of input section of each of OR gates OG41 and OG51 is formed.

In this case, the other sides of input section of OR gates OG41, and OR51 are both grounded.

Now, when the transfer signal TX[4n] is high level "H", since the other side of input of OR gate OG41 is grounded, the output becomes high level "H" and the row of TX'[4n] becomes in a read out state Similarly, when the transfer signal TX[4n+3] is high level "H", since the other side of input of OR gate OG51 is grounded, the output becomes high level "H" and the row of TX'[4n+3] becomes in a readout state.

On the contrary, the transfer control line LTX[4n+1] and LTX[4n+2], which are unread rows, are also arranged with the OR gates OG40 and OG50 respectively, and one side of input section of the OR gates OG40, OG50 are formed.

The other side of input section of the OR gates OG40, OG50 is supplied with outputs V1' and V2' of the NOR gate NG11 and the NOR gate NG12 respectively.

One side of the input section of the NOR gate NG11 and NOR gate NG12 is supplied with a thinning signal SIG[m'], and the other sides of the input sections are connected together to the selection control line SEL[n].

NAND gate NA3 is arranged between the selection control line SEL[n] and the reset control line RST[n], so as to treat each of them as an input section whose output is RST'[n].

Regarding other two of pixels having a shared relationship with the readout pixel, in order to cancel high level of reset fixing to turn into an unread state, the reset signal RST[n] and the selection signal SEL[n] are both need to be high level "H", and the output RST'[n] is need to be low level "L".

At this time, if the thinning signal SIG[m'] is set to high level "H", outputs V1' and V2' of NOR gate NG11 and NOR gate NG12 become low level "L".

When the transfer signal TX[4n+1] AND TX[4n+2] are low level "L", outputs of OR gates OG40 and OG50 become low level "L", therefore, each row of TX'[4n+1] and TX'[4n+2] becomes in a unread state.

FIG. 17 shows circuits and operation functions indicating in groups in MIL logic symbols related to FIG. 16.

If the pixel control section described above connects A1 or A2 to a predetermined connection section at the time of layout so that G1 and G2 falls into GND respectively, the following two effect can be expected.

It is expected that logic gates of same combination are inserted to all rows.

This makes production process very simple since only sorting contacts is needed. Gates to be align are completely the same for all rows, and sorting should be done only whether to connect to GND or to a gate, like to read only contact/not to read/not to read/to read . . . .

It is possible to respond to a change of an interval of thinning, and designing circuits will be easy.

Precise timing control, such as for outputting shared pixels at this particular timing while waiting for the timing, will be completely unnecessary.

It can be applied for reading thinning of various pixel shared structure, not only 2 pixels shared but also 4 pixels shared.

It becomes easy to switch between reading all pixels and reading thinning, and they can be done easily.

As described above, the present embodiment can arrange a logic gate composed of a plurality of logic circuits combination on a transfer line of pixel shared structure.

An unread pixel is normally to be fixed to a reset state, and when reading a readout pixel in a shared relationship, and if its address is selected or if a selection signal becomes active, the logic gate cancels the reset state of the unread pixels to turn into an unread state.

Further, the above logic gate configuring a logic circuit that cancels the reset state of unread pixels is repeated in a cycle same with a cycle of shared pixels, and it is possible to change control of readout pixels and unread pixels only by connection relationship of its logic gate.

Therefore, according to the present embodiment, it is possible to obtain the following effectiveness.

Driving ability of a control line selection driver can be reduced only at a time of a global shutter.

This can reduce a peak current at a time of PD reset of the global shutter, in parallel with switching the reset signal RST and the transfer signal TX at sufficient speed at a time of rolling shutter and data read.

As the result, devices can be prevented from being broken caused by quality deterioration or latch-up.

Moreover, according to the structure of FIG. 16, it is possible to narrow an area for driver to reduce costs.

Note that CMOS image sensors according to each embodiment are not limited to in particular, but can be configured as CMOS image sensors mounted with a column-parallel type analog-digital converter (hereinafter, referred to as ADC (Analog Digital Converter)), for example.

2. Second Embodiment

Figure 18:
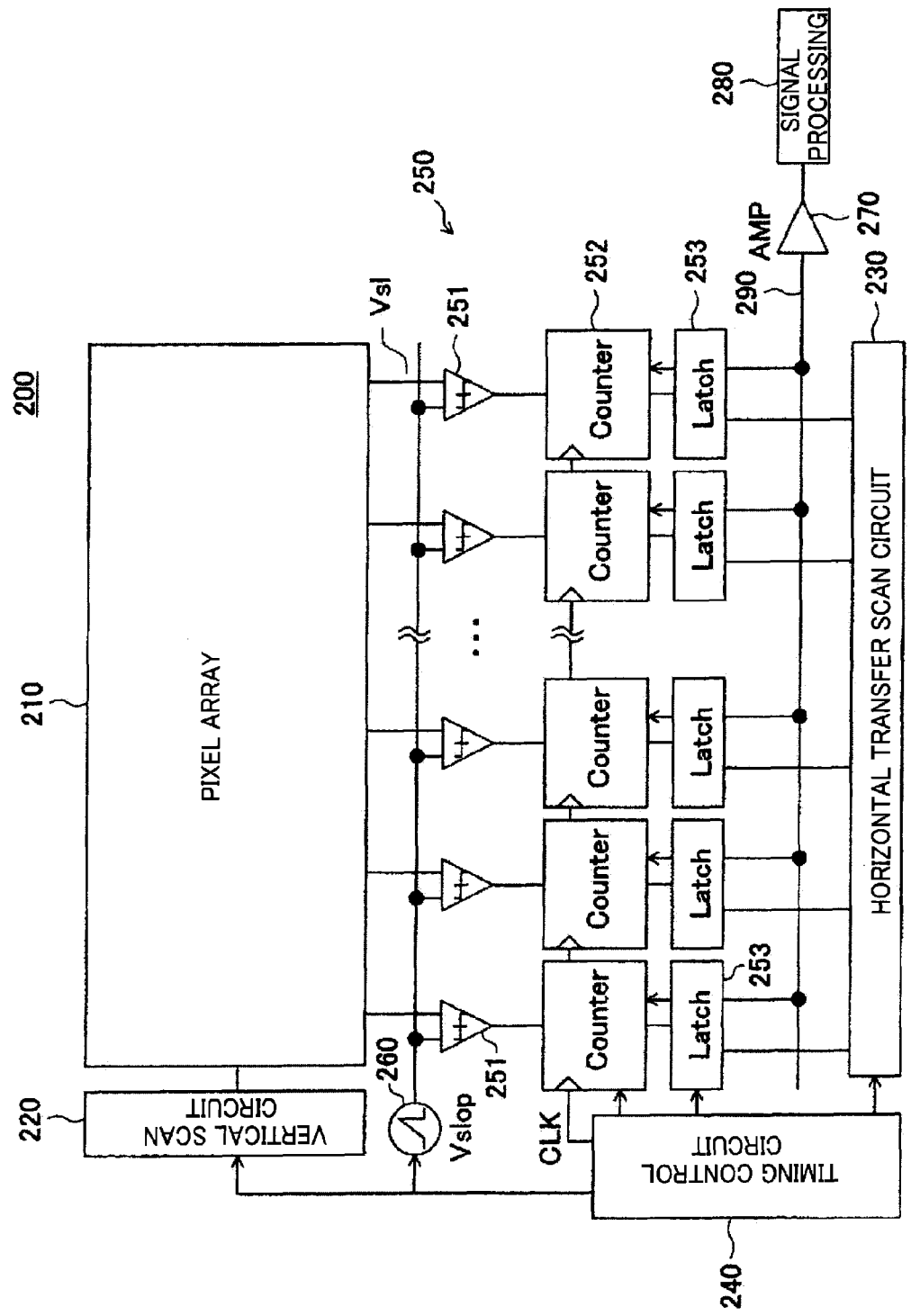
FIG. 18 is a block diagram showing an example of a solid-state image pickup device mounted with a column-parallel ADC (a CMOS image sensor) according to the second embodiment of the present invention.

FIG. 18 is a block diagram showing an example of a solid-state image pickup device mounted with a column-parallel ADC (a CMOS image sensor) according to the second embodiment of the present invention.

This solid-state image pickup device 200 includes, as shown in FIG. 18, a pixel array unit 210 as an imaging section, a vertical scan circuit 220 as a pixel driving section, a horizontal transfer scan circuit 230, and a timing control circuit 240.

Further, the solid-state image pickup device 200 includes an ADG group 250, a digital-analog converter (hereinafter, referred to as DAC (Digital Analog Converter)) 260, an amplifier circuit (S/A) 270, and a signal processing circuit 280.

The pixel array section 210 is configured by being arranged with pixels, as shown in FIG. 4, for example, including a photodiode and an in-pixel amplifier, in matrix (row-column).

Moreover, the solid-state image pickup device is equipped with the following circuits as a control circuit for sequentially reading signals of a pixel array section 210.

That is, the solid-state image pickup device 200 is equipped with a timing control circuit that generates inner clock as a control circuit, a vertical scan circuit 220 that controls row address and row scanning, and a horizontal transfer scan circuit 230 that controls column address and column scanning.

In addition, the vertical scan circuit 220 is applied with the vertical scan circuit that has been explained in association with the above-described FIG. 4 to FIG. 17.

The ADG group 250 is arranged with ADC, having a comparator 251, a counter 252, and a latch 253, in a plurality of columns.

The comparator 251 compares a reference voltage Vslop, a ramp waveform (RAMP) which has been changed in a staircase pattern from a reference voltage generated by the DAC 260, and an analog signal obtained from a pixel for each of a row line via a vertical signal line.

The counter 252 counts comparison time of the comparator 251.

The ADC group 250 has a feature of n-bit digital signal conversion, is arranged for each of the vertical signal line (column line), and configures a column-parallel ADC block.

Output of each of the latch 253 is connected to the horizontal transfer line 290 with 2n-bit width, for example.

Then 2n pieces of an amplifier circuit 270 that support the horizontal transfer line 290, and a signal processing circuit 280.

In the ADC group 250, an analog signal (electric potential Vsl) that has been readout by the vertical signal line is compared with the reference voltage Vslop (a slope waveform to be changed in linear with some slope) in the comparator 251 arranged for each column.

At this time, the counter 252 arranged for each column same as the comparator 251 is operating and converts the electric potential of the vertical signal line (analog signal) Vsl into a digital signal, while the electric potential Vslop with RAMP and counter values support each other by each pair to change.

The change of the reference voltage Vslop is a conversion from a change in voltage to a change in time, and converts the time into a digital signal by counting the time I some cycle (clock).

When the analog electrical signal Vsl and the reference voltage Vslop intersect, an output of the comparator 251 inverts, an input clock of the counter 252 is stopped, and the AD conversion is completed.

After above period of AD conversion, the horizontal transfer scan circuit 230 inputs data contained by the latch 253 into the signal processing circuit 280 via the horizontal transfer line 290 and an amplifier circuit 270, and generates 2D images In such manner, a column-parallel output processing is performed.

The solid-state image pickup device having such advantages can be applied to a digital camera or a video camera, as an imaging device.

3. Third Embodiment

Figure 19:
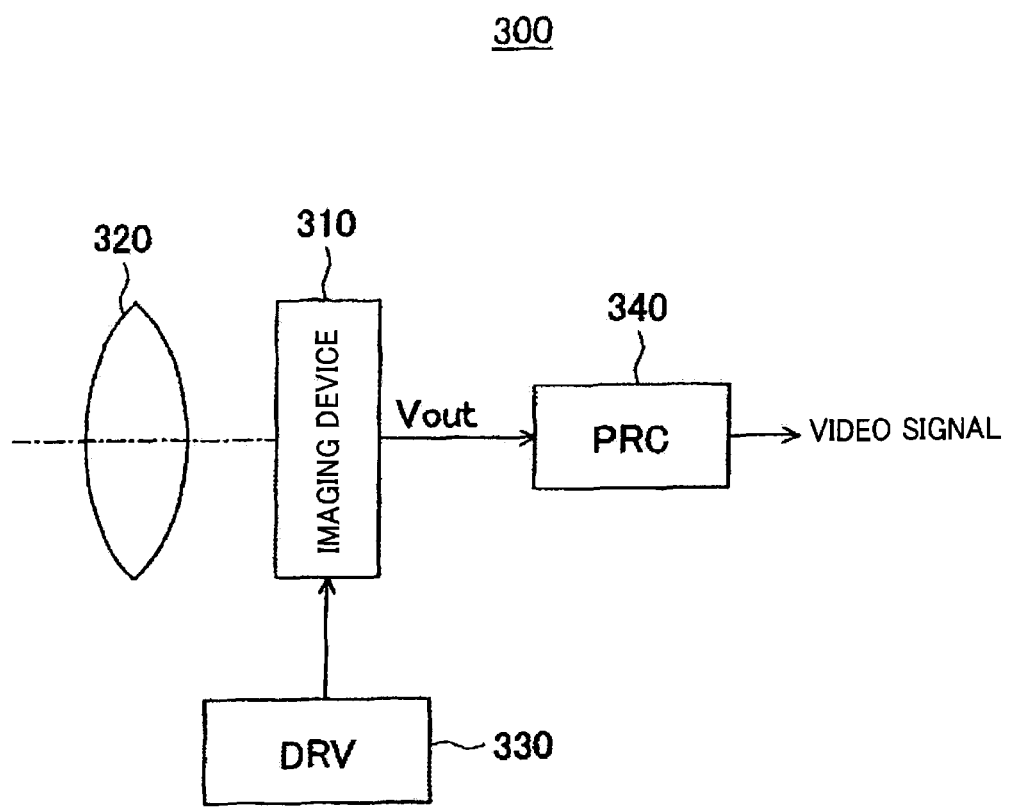
FIG. 19 is a diagram showing a configuration example of a camera system to which the solid-state image pickup device is applied according to the third embodiment of the present invention.

FIG. 19 is a diagram showing a configuration example of a camera system to which the solid-state image pickup device is applied according to the third embodiment of the present invention.

The camera system 300 includes, as illustrated in FIG. 19, the imaging device 310 that a CMOS image sensor (solid-state image pickup device) 100 and 200 according to the present embodiment can be applied.

Further, the camera system 300 includes an optical system that leads incident light (forms an image of a subject) into a pixel region of the imaging device 310, for example, a lens 320 that makes an incident light (image light) to form an image on imaging surface.

The camera system 300 includes a driving circuit (DRV) 330 that drives the imaging device 310, a signal processing circuit (PRC) 340 that processes output signals of the imaging device 310.

The driving circuit 330 includes a timing generator (not shown) that generates various timing signals including start pulse and clock pulse which drive circuits within the imaging device 310, and drives the imaging device 310 using a predetermined timing signals.

Further, a signal processing circuit 340 executes a predetermined signal processing to output signals of the imaging device 310.

Image signals processed in the signal processing circuit 340 are recorded in a storage medium, such as a memory, or the like. Image information recorded in the storage medium is to take hard copy using a printer, or the like. Moreover, the image signals processed in the signal processing circuit 340 is to be displayed on a monitor composed of a liquid crystal display or the like as a video.

As described above, in an imaging apparatus such as a digital still camera, a camera with low power consumption and high accuracy can be realized by mounting the above-mentioned imaging devices 100 and 200 as the imaging device 310.

What is claimed:

1. A solid-state image pickup device comprising:
   a pixel section including a plurality of pixels, each pixel having at least one photoelectric conversion element; and
   a pixel driving section configured to control the pixel section;
   wherein,
      the pixel section includes two or more pixels which share at least one transistor element and when the pixels are driven at least one becomes a readout pixel and at least one becomes an unread pixel, and
      the pixel driving section is configured to set a reset state for the unread pixel and when reading an electrical charge from the readout pixel which shares the same transistor element cancel the reset state of the unread pixel to place the unread pixel into an unread state.

2. The solid-state image pickup device according to claim 1, wherein each of the pixels has a floating diffusion to store the electrical charge from the photoelectric conversion element.

3. The solid-state image pickup device according to claim 1, wherein the transistor element is a transfer transistor to read the electrical charge from the photoelectric conversion element.

4. The solid-state image pickup device according to claim 1, wherein the transistor element is an amplifying transistor to convert the electrical charge from the photoelectric conversion element to an image signal.

5. The solid-state image pickup device according to claim 1, wherein the transistor element is a reset transistor to set the reset state on each of the pixels.

6. The solid-state image pickup device according to claim 4, wherein the transistor element is a select transistor to read the image signal from the amplifying transistor to a vertical signal line.

7. The solid-state image pickup device according to claim 1, wherein the pixel control section configured to connect to a gate of the transistor element.

8. A camera system comprising:
a solid-state image pickup device;
an optical system configured to form an image of a subject on the image pickup device; and
a signal processing circuit for processing an output image signal of the image pickup device,
wherein the solid-state image pickup device includes:
a pixel section including a plurality of pixels, each pixel having at least one photoelectric conversion element; and
a pixel driving section configured to control the pixel section;
wherein,
the pixel section includes two or more pixels which share at least one transistor element, and when the pixels are driven at least one becomes a readout pixel and at least one becomes an unread pixel and
the pixel driving section is configured to set a reset state for the unread pixel and when reading an electrical charge from the readout pixel which shares the same transistor element cancel the reset state of the unread pixel to place the unread pixel into an unread state.

9. The camera system according to claim 8, wherein each of the pixels has a floating diffusion to store the electrical charge from the photoelectric conversion element.

10. The camera system according to claim 8, wherein the transistor element is a transfer transistor to read the electrical charge from the photoelectric conversion element.

11. The camera system according to claim 8, wherein the transistor element is an amplifying transistor to convert the electrical charge from the photoelectric conversion element to an image signal.

12. The camera system according to claim 8, wherein the transistor element is a reset transistor to set the reset state on each of the pixels.

13. The camera system according to claim 11, wherein the transistor element is a select transistor to read the image signal from the amplifying transistor to a vertical signal line.

14. The camera system according to claim 8, wherein the pixel control section configured to connect to a gate of the transistor element.

* * * * *